(12) United States Patent
Koyama

(10) Patent No.: US 9,183,894 B2
(45) Date of Patent: Nov. 10, 2015

(54) SEMICONDUCTOR DEVICE

(71) Applicant: Semiconductor Energy Laboratory Co., Ltd., Atsugi-shi, Kanagawa-ken (JP)

(72) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 133 days.

(21) Appl. No.: 13/766,971

(22) Filed: Feb. 14, 2013

(65) Prior Publication Data

US 2013/0223135 A1 Aug. 29, 2013

(30) Foreign Application Priority Data

Feb. 24, 2012 (JP) ................................. 2012-038468
May 3, 2012 (JP) ................................. 2012-105537
Aug. 31, 2012 (JP) ................................. 2012-192232

(51) Int. Cl.
*G11C 11/24* (2006.01)
*G11C 11/00* (2006.01)
*G11C 5/14* (2006.01)
*G11C 11/412* (2006.01)
*G11C 11/419* (2006.01)

(52) U.S. Cl.
CPC *G11C 5/14* (2013.01); *G11C 11/24* (2013.01); *G11C 11/412* (2013.01); *G11C 11/419* (2013.01)

(58) Field of Classification Search
USPC .................................. 365/149, 154, 156, 226
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 5,933,384 A * | 8/1999 | Terada et al. ................. 365/226 |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Trong Phan
(74) *Attorney, Agent, or Firm* — Fish & Richardson P.C.

(57) ABSTRACT

The memory device includes a first logic element which is supplied with a first power supply voltage, and inverts a polarity of a potential of an input terminal to output the potential with the inverted polarity from an output terminal, a second logic element which is supplied with a second power supply voltage supplied through a different path from the first power supply voltage, and inverts a polarity of a potential of an input terminal to output the potential with the inverted polarity from an output terminal, a first memory circuit connected to the input terminal of the first logic element, and a second memory circuit connected to the input terminal of the second logic element. The input terminal and the output terminal of the first logic element are connected to the output terminal and the input terminal of the second logic element, respectively.

12 Claims, 17 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,741,489 B2 | 5/2004 | Takasu et al. |
| 6,990,011 B2* | 1/2006 | McClure ............. 365/154 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,236,396 B2* | 6/2007 | Houston et al. ............ 365/154 |
| 7,257,017 B2 | 8/2007 | Liaw |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,486,579 B2* | 2/2009 | Tsukada ............. 365/149 |
| 7,501,293 B2 | 3/2009 | Ito et al. |
| 7,609,541 B2* | 10/2009 | Burnett et al. ............. 365/154 |
| 7,674,650 B2 | 3/2010 | Akimoto et al. |
| 7,732,819 B2 | 6/2010 | Akimoto et al. |
| 7,957,176 B2* | 6/2011 | Otsuka ............. 365/154 |
| 8,174,872 B2 | 5/2012 | Sakimura et al. |
| 8,314,637 B2 | 11/2012 | Kato et al. |
| 8,450,778 B2* | 5/2013 | Chang et al. ............. 365/154 |
| 8,593,856 B2* | 11/2013 | Koyama et al. ............. 365/149 |
| 8,724,374 B1* | 5/2014 | Grover et al. ............. 365/154 |
| 8,787,102 B2* | 7/2014 | Ishizu ............. 365/149 |
| 8,804,405 B2* | 8/2014 | Kimura et al. ............. 365/149 |
| 8,817,516 B2 | 8/2014 | Koyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0121878 A1 | 5/2011 | Kato et al. |
| 2011/0156024 A1 | 6/2011 | Koyama et al. |
| 2011/0187410 A1 | 8/2011 | Kato et al. |
| 2012/0262982 A1 | 10/2012 | Takemura |
| 2012/0287701 A1 | 11/2012 | Takemura |
| 2012/0294068 A1 | 11/2012 | Ishizu |
| 2012/0294069 A1 | 11/2012 | Ohmaru et al. |
| 2012/0294102 A1 | 11/2012 | Ishizu |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-152506 A | 5/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |
| WO | 2009/072511 A1 | 6/2009 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID Inter-

(56) References Cited

OTHER PUBLICATIONS national Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Ando Koji; "Nonvolatile Magnetic Memory"; FED Review, vol. 1, No. 14; pp. 1-8; Mar. 2002; with English translation.
K. Ando; "Non-Volatile Magnetic Memory"; FED Review; Mar. 14, 2002; pp. 1-8; vol. 1, No. 14.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

(56) References Cited

OTHER PUBLICATIONS

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

FIG. 2

| | T1 | T2 | T3 | T4 | T5 | T6 | T7 | T8 |
|---|---|---|---|---|---|---|---|---|
| Switches 103,104 | ON | OFF | OFF | OFF | OFF | OFF | OFF | ON |
| Memory circuits 120,121 | | | Write | Hold | | Read | | |
| Wiring 111 | VDD | VDD | VDD | VSS | VDD | VDD | VDD | VDD |
| Wiring 112 | VDD | VDD | VDD | VSS | VSS | VSS | VDD | VDD |

FIG. 4

| | T1 | T2 | T3 | T4 | T5 | T6 | T7 | T8 |
|---|---|---|---|---|---|---|---|---|
| Switches 103,104 | ON | OFF | OFF | OFF | OFF | OFF | OFF | ON |
| Switches 107,108 | OFF | OFF | ON | OFF | OFF | ON | ON→OFF | OFF |
| Wiring 111 | VDD | VDD | VDD | VSS | VDD | VDD | VDD | VDD |
| Wiring 112 | VDD | VDD | VDD | VSS | VSS | VSS | VDD | VDD |

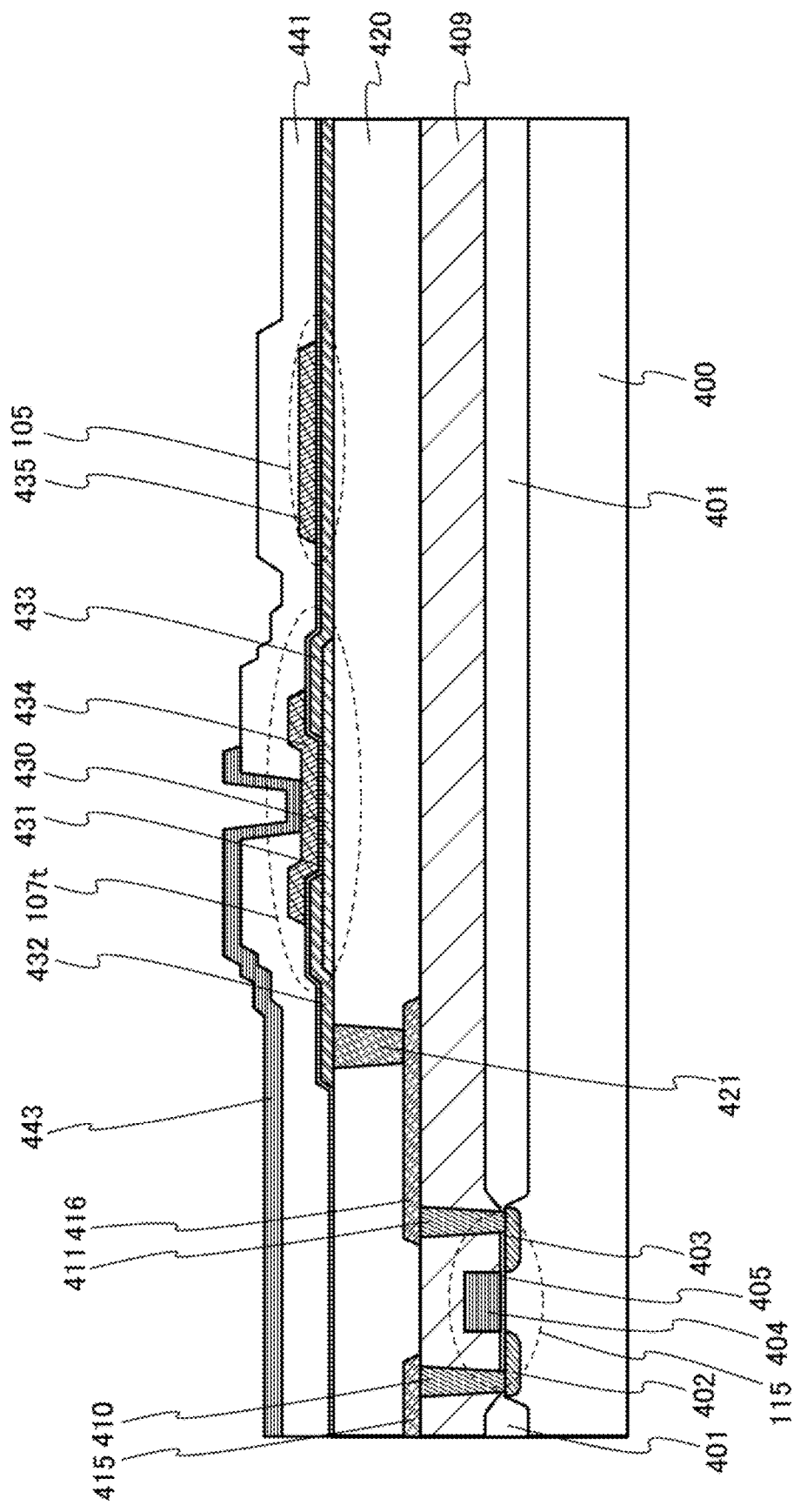

SEMICONDUCTOR DEVICE

BACKGROUND OF THE INVENTION

1. Field of the Invention

The present invention relates to a memory device and a semiconductor device including the memory device.

2. Description of the Related Art

Semiconductor elements of semiconductor devices such as central processing units (CPUs) has been downsized to increase operation speed and integration degree, and now transistors with a channel length of approximately 30 nm are manufactured. On the other hand, downsizing semiconductor elements leads to an increase in power consumption (leakage power) due to leakage current of transistors in CPUs. Specifically, most of power consumption of conventional CPUs is power consumption (operation power) at the time of calculations, while leakage power accounts for at least 10% of power consumption of CPUs in recent years.

In particular, a cache often has large capacity to achieve high CPU throughput, and corresponds to an integrated circuit whose leakage power is the largest among elements of a CPU. In particular, caches in a CPU for portable devices such as mobile phones and portable information terminals occupy more than or equal to half a chip area or more than or equal to half the number of transistors; therefore, a reduction in leakage power of caches is highly needed. Accordingly, attention is paid to a technique called normally-off computing in which power consumption of a CPU is reduced in such a manner that the supply of power to integrated circuits such as caches that are inactive is stopped by power gating (Non-Patent Document 1). The supply of power is stopped within a short time in the normally-off computing; accordingly, a memory element serving as a cache is required to not only be nonvolatile but also operate at a high speed. Flash memories, which are nonvolatile memories, are incapable of performing such high-speed operation and have an insufficient number of data rewrites for use as a cache.

In view of the above, a memory device in which a nonvolatile memory element which can operate at a higher speed and has a larger number of data rewrites than a flash memory is provided in addition to a volatile memory element which is conventionally used for a cache is proposed. Patent Document 1 discloses an electronic circuit which includes a volatile data holding circuit using an inverter and a ferro-electric capacitor and in which data can be held by storing the data in the ferro-electric capacitor even when the supply of power is stopped. Patent Document 2 discloses a nonvolatile latch circuit which is formed using first and second inverters connected in a cross-coupled structure and first and second magnetoresistive elements.

REFERENCE

[Patent Document 1] Japanese Published Patent Application No. 2003-152506

[Patent Document 2] PCT International Publication No. 2009/072511

[Non-Patent Document 1] Koji Ando, "FUKIHATSUSEI JIKIMEMORI" [Nonvolatile Magnetic Memory], *FED Review*, vol. 1, No. 14, 14 Mar. 2002.

SUMMARY OF THE INVENTION

The above memory device has a problem in that a short period of stopping the supply of power is likely to result in an increase in power consumption of a CPU when a period of stopping the supply of power in which an electric power consumed by saving and restoring of data (overhead) and an electric power saved by stopping the supply of power are equal to each other, that is, a break even time (BET) is long.

In addition, in the above memory device, data is saved from a volatile memory element to a nonvolatile memory element before the supply of power is stopped, and the data is restored to the volatile memory element after the supply of power is restarted. However, the volatile memory element generally includes a flip-flop, and the potential of any node between semiconductor elements included in a flip-flop is in an indefinite state while the supply of power is stopped. The potential of the node in an indefinite state cannot be expected to be determined at which of a high level or a low level after the supply of power is restarted. After the supply of power is restarted, the potential of the node becomes stable because of the supply of power whichever a high level or a low level the potential becomes. Therefore, data is sometimes cancelled depending on the potential of the node when data is restored from the nonvolatile memory element. Consequently, the stop of the supply of power is likely to generate low-reliability data of the memory device.

In view of the foregoing technical background, an object of the present invention is to provide a memory device that can operate with low power consumed in data write. Alternatively, an object of the present invention is to provide a memory device from which highly reliable data is obtained.

Alternatively, an object of the present invention is to provide a semiconductor device whose power consumption is low because of the use of the memory device. Alternatively, an object of the present invention is to provide a semiconductor device that is highly reliable because of the use of the memory device.

In order to solve the above problems, the memory device having a first structure of the present invention includes first and second logic elements where the potential of an output terminal of one logic element is input to an input terminal of the other logic element and each of which inverts the polarity of the potential of the input terminal to output the potential from the output terminal, and a memory circuit which stores data of the first and second logic elements. In one embodiment of the present invention, power supply voltages supplied to the first and second logic elements are supplied through different paths.

In a memory device with the first structure, data stored in the first and second logic elements can be saved on a memory circuit before the supply of the power supply voltages to the memory device is stopped. Specifically, for the memory circuit, a circuit element which can hold data in a period during which the supply of the power supply voltages to the memory device is stopped, such as a capacitor, an MRAM, an ReRAM, or an FeRAM can be used.

In the memory device with the first structure of the present invention, a power supply voltage supplied to the first logic element and a power supply voltage supplied to the second logic element are supplied through different paths, so that when data stored in the memory circuit is restored to the first and second logic elements, the state can be made where the power supply voltage is supplied to one of the first and second logic elements and the power supply voltage is not supplied to the other. As a result, the following operations can be performed sequentially, not at the same time: an operation in which a power supply voltage is supplied to only one of the first and second logic elements, an operation in which saved data is written to the first and second logic elements, and an operation in which the power supply voltages are supplied to both the first and second logic elements so that the data is held in the first and second logic elements.

Therefore, in a memory device according to one embodiment of the present invention, even when the potential of a node of the first logic element or the second logic element, such as an input terminal or an output terminal, is in an indefinite state during the stop of the supply of power supply voltages to the memory device, the potential of the node, which is in an indefinite state, can be surely defined in accordance with data because saved data can be restored after a power supply voltage is supplied to one of the logic elements first. As a result, high reliability of the data can be ensured even after the data is restored from the memory circuit to the first and second logic elements.

Alternatively, a memory device with a second structure of the present invention includes first and second logic elements where the potential of an output terminal of one logic element is input to an input terminal of the other logic element and each of which inverts the polarity of the potential of the input terminal to supply the potential to the output terminal, switches, and capacitors in which data that is written to the first and second logic elements through the switches is stored. In addition, in one embodiment of the present invention, power supply voltages supplied to the first and second logic elements of the memory device with the second structure may be supplied through different paths.

In the memory device with the second structure, data held in the first and second logic elements can be saved in the capacitor before stopping the supply of power supply voltages to the memory device. Specifically, the data is saved by supply of electric charge to the capacitor, and the electric charge is held by turning off the switch.

In the memory device with the second structure of the present invention, a power supply voltage supplied to the first logic element and a power supply voltage supplied to the second logic element are supplied through different paths, so that the state can be made where the power supply voltage is supplied to one of the first and second logic elements and the power supply voltage is not supplied to the other when electric charge held in the capacitor is discharged to restore saved data to the first and second logic elements. As a result, the following operations can be performed sequentially, not at the same time: an operation in which a power supply voltage is supplied to only one of the first and second logic elements, an operation in which the saved data is written to the first and second logic elements, and an operation in which the power supply voltages are supplied to both the first and second logic elements so that the data is held in the first and second logic elements.

Therefore, in a memory device with the second structure of the present invention, even when the potential of a node of the first logic element or the second logic element, such as an input terminal or an output terminal, is in an indefinite state during the stop of the supply of power supply voltages to the memory device, the potential of the node, which is in an indefinite state, can be surely defined in accordance with data because saved data can be restored after a power supply voltage is supplied to one of the logic elements first. As a result, high reliability of the data can be ensured even after the data is restored from the memory circuit to the first and second logic elements.

In a memory device with the first or second structure of the present invention, saving data prevents the data in the memory device from being lost, even when the supply of power supply voltages is stopped. Because there is no necessity of saving data on an external memory device, the supply of the power supply voltages to the memory device or a semiconductor device using the memory device can be stopped even for a long time such as 60 seconds or for a short time in milliseconds, which results in a reduction in power consumption of the memory device or the semiconductor device.

Further, the memory device with the second structure of the present invention may also have a configuration requirement in which the switch may be a transistor having a low off-state current. For example, a transistor having a channel formation region containing a semiconductor that has a wide band gap and is highly purified by reducing impurities such as moisture and hydrogen, which function as electron donors (donors), and oxygen defects has an extremely low off-state current. In one embodiment of the present invention, a transistor with the structure is used as the switch to prevent electric charge held in a capacitor from leaking, and therefore, the reliability of data can be increased.

In addition, a memory device with the second structure of the present invention performs data write by supplying electric charge to a capacitor, and consequently, a current needed for data write can be approximately $\frac{1}{100}$ of that of an MRAM or the like. Therefore, in one embodiment of the present invention, BET can be short because overhead needed for stopping the supply of power can be smaller than that in the case of an MRAM. As a result, power consumption of a semiconductor device according to one embodiment of the present invention which uses the memory device and can be lower than that in the case of using an MRAM.

Specifically, a memory device according to one embodiment of the present invention includes a first logic element which is supplied with a first power supply voltage, and then inverts a polarity of a potential of an input terminal to output the potential with the inverted polarity from an output terminal, a second logic element which is supplied with a second power supply voltage supplied through a different path from the first power supply voltage, and then inverts a polarity of a potential of an input terminal to output the potential with the inverted polarity from an output terminal, a first memory circuit connected to the input terminal of the first logic element, a second memory circuit connected to the input terminal of the second logic element, a first switch configured to control connection between the input terminal of the first logic element and a first wiring, and a second switch configured to control connection between the input terminal of the second logic element and a second wiring. In the memory device, the input terminal of the first logic element is connected to the output terminal of the second logic element. In addition, the input terminal of the second logic element is connected to the output terminal of the first logic element.

Specifically, a memory device according to one embodiment of the present invention includes a first logic element which is supplied with a first power supply voltage, and then inverts a polarity of a potential of an input terminal to output the potential with the inverted polarity from an output terminal; a second logic element which is supplied with a second power supply voltage supplied through a different path from the first power supply voltage, and then inverts a polarity of a potential of an input terminal to output the potential with the inverted polarity from an output terminal; a first capacitor; a second capacitor; a first switch configured to control connection between the input terminal of the first logic element and the first capacitor; a second switch configured to control connection between the input terminal of the second logic element and the second capacitor; a third switch configured to control connection between the input terminal of the first logic element and a first wiring; and a fourth switch configured to control connection between the input terminal of the second logic element and a second wiring. In the memory device, the input terminal of the first logic element is connected to the output terminal of the second logic element, and the input terminal of the second logic element is connected to the output terminal of the first logic element.

According to one embodiment of the present invention, a memory device from which highly reliable data is obtained can be provided. According to one embodiment of the present invention, a memory device whose power consumption in data write can be low and which is nonvolatile and writes data at a high speed can be provided. According to one embodiment of the present invention, a highly reliable semiconductor device can be provided. According to one embodiment of the present invention, a semiconductor device whose power consumption is low can be provided.

BRIEF DESCRIPTION OF THE DRAWINGS

FIG. 2 is a timing chart.
FIG. 4 is a timing chart.
FIG. 13 is a cross sectional view of a semiconductor device.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

The present invention includes in its category the following semiconductor devices in which a memory device can be used: integrated circuits such as microprocessors, image processing circuits, digital signal processors (DSPs), and microcontrollers, RF tags, and semiconductor display devices. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a memory device is included in a driver circuit or a control circuit.

(Embodiment 1)

Figure 1:
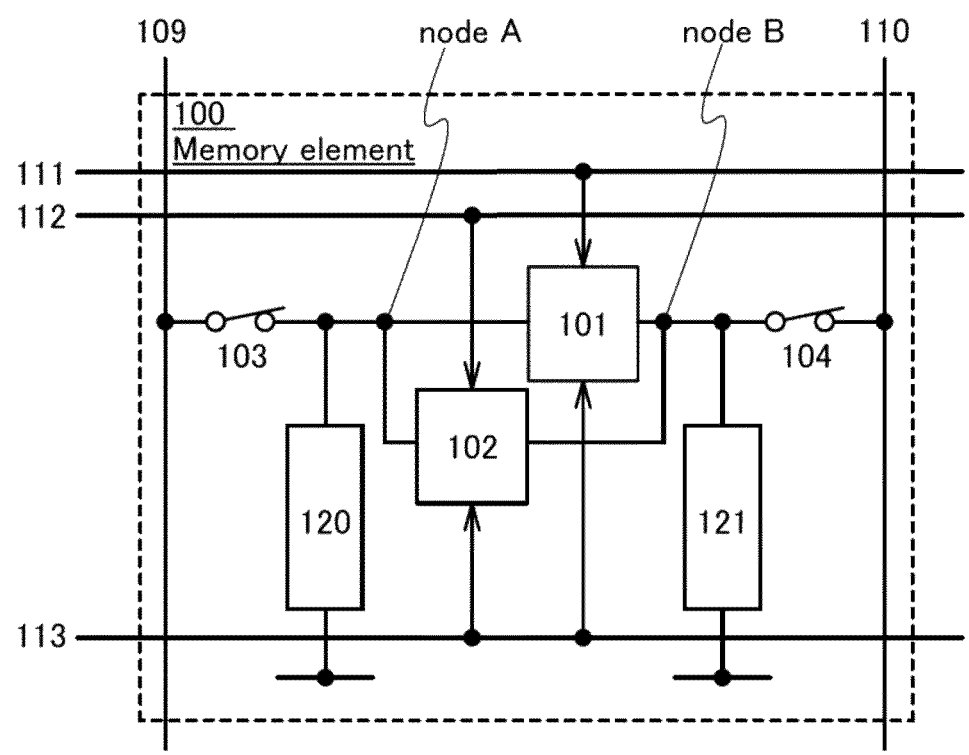
FIG. 1 illustrates a structure of a memory element.

A memory device according to one embodiment of the present invention includes at least one memory element 100 capable of storing one-bit data. FIG. 1 shows the structure of the memory element 100.

The memory element 100 includes a logic element 101, a logic element 102, a switch 103, a switch 104, a memory circuit 120, and a memory circuit 121.

The logic elements 101 and 102 each have a function of inverting the polarity of the potential of an input terminal to output the potential from an output terminal. That is, the logic elements 101 and 102 each have a function of inverting a logic level of a signal. Specifically, the logic elements 101 and 102 each can be an inverter, a clocked inverter, or the like. In addition, the input terminal of the logic element 101 is connected to the output terminal of the logic element 102, and the input terminal of the logic element 102 is connected to the output terminal of the logic element 101.

The memory element 100 is connected to wirings 109 to 113. Data write and data read to/from the memory element 100 are performed through the wirings 109 and 110. The switch 103 has a function of controlling writing of data supplied to the wiring 109 to the logic elements 101 and 102 and reading of the data from the logic elements 101 and 102 to the wiring 109. The switch 104 has a function of controlling writing of data supplied to the wiring 110 to the logic elements 101 and 102 and reading of the data from the logic elements 101 and 102 to the wiring 110.

Specifically, in FIG. 1, the switch 103 has a function of controlling electrical connection between the input terminal of the logic element 101 and the wiring 109, and the switch 104 has a function of controlling electrical connection between the input terminal of the logic element 102 and the wiring 110.

The wirings 111 to 113 each have a function of supplying a power supply potential to the memory element 100. Specifically, in FIG. 1, a difference between a power supply potential supplied to the wiring 111 and a power supply potential supplied to the wiring 113 is supplied to the logic element 101 as a power supply voltage. In addition, in FIG. 1, a difference between a power supply potential supplied to the wiring 112 and a power supply potential supplied to the wiring 113 is supplied to the logic element 102 as a power supply voltage.

In one embodiment of the present invention, with the structure, a power supply voltage supplied to the logic element 101 and a power supply voltage supplied to the logic element 102 can be supplied through different paths. Supplying power supply voltages through different paths can make the state where the power supply voltage is supplied to the logic element 101 and the power supply voltage is not supplied to the logic element 102, or the state where the power supply voltage is supplied to the logic element 102 and the power supply voltage is not supplied to the logic element 101.

Note that the state where a power supply voltage is not supplied to the logic element 101 means that a potential difference between the wiring 111 and the wiring 113 is close to 0 V, and the state where a power supply voltage is not supplied to the logic element 102 means that a potential difference between the wiring 112 and the wiring 113 is close to 0 V.

The supply of power supply voltages enables the logic elements 101 and 102 to hold data written through the switch 103 or 104.

The memory circuits 120 and 121 each have a function of storing data even while the supply of the power supply voltages is stopped. Specifically, in FIG. 1, the memory circuit 120 and the memory circuit 121 are connected to the input terminal of the logic element 101 and the input terminal of the logic element 102, respectively. With this structure, data held in the logic elements 101 and 102 is saved on the memory circuits 120 and 121 before the supply of a power supply voltage to the memory element 100 is stopped, whereby loss of the data can be prevented.

Note that the memory circuits 120 and 121 each can be a circuit element which can hold data in a period during which the supply of a power supply voltage is stopped, such as a capacitor, an MRAM, an ReRAM, or an FeRAM.

The memory element 100 may also include another circuit element such as a transistor, a diode, a resistor, or an inductor, as needed.

A timing chart in FIG. 2 shows an example of the operation of the memory element 100 illustrated in FIG. 1. According to the timing chart in FIG. 2, operation of the memory element 100 is changed depending on periods (periods T1 to T8). In the periods T1, T2, and T8, data is written, held, and read to/in/from the logic elements 101 and 102. In the periods T3 to T7, the supply of power supply voltages to the logic elements 101 and 102 is stopped and restarted and data is saved and restored.

The operation of the memory element 100 in each period will be described below in detail. Note that the following description is made assuming that a power supply potential VSS which is a low-level potential is always supplied to the wiring 113.

In the period T1, data is written to the memory element 100 through the wirings 109 and 110. Specifically, the switches 103 and 104 are turned on (conduction state). A first potential of a signal including the data is supplied to the input terminal of the logic element 101 through the switch 103 from the wiring 109. A second potential which is obtained by inverting the polarity of the first potential is supplied to the input terminal of the logic element 102 through the switch 104 from the wiring 110.

A power supply potential VDD which is a high-level potential is supplied to the wirings 111 and 112. A power supply voltage corresponding to the difference between the power supply potential VSS and the power supply potential VDD is supplied to the logic elements 101 and 102. As a result, the supply of power supply voltages enables the logic elements 101 and 102 to hold written data.

In the period T2, data written to the memory element 100 is held in the logic elements 101 and 102. Specifically, the switches 103 and 104 are turned off (non-conduction state). The power supply potential VDD is supplied to the wirings 111 and 112. A power supply voltage corresponding to the difference between the power supply potential VSS and the power supply potential VDD is supplied to the logic elements 101 and 102. Then, the first potential of the signal including the data is held at the input terminal of the logic element 101 and the output terminal of the logic element 102, and the second potential is held at the input terminal of the logic element 102 and the output terminal of the logic element 101.

In the period T3, the data held in the logic elements 101 and 102 is saved on the memory circuits 120 and 121. Specifically, the switches 103 and 104 are off. The power supply potential VDD is supplied to the wirings 111 and 112. The power supply voltage corresponding to the difference between the power supply potential VSS and the power supply potential VDD is supplied to the logic elements 101 and 102. Further, the first potential of the signal including the data is written from the input terminal of the logic element 101 and the output terminal of the logic element 102 to the memory circuit 120, and the second potential is written from the input terminal of the logic element 102 and the output terminal of the logic element 101 to the memory circuit 121. Consequently, the data is written to the memory circuits 120 and 121.

In the period T4, the supply of the power supply voltage to the memory element 100 is stopped. Specifically, the switches 103 and 104 are off. The power supply potential VSS is supplied to the wirings 111 and 112. Accordingly, the potential differences between the wiring 111 and the wiring 113 and between the wiring 112 and the wiring 113 become close to 0 V, so that the supply of the power supply voltage to the logic elements 101 and 102 is stopped. Therefore, leakage power caused by off-state current of transistors in the logic elements 101 and 102 can be made to be close to zero. The memory circuits 120 and 121 hold the data of the logic elements 101 and 102 that is written in the period T3.

Note that in the period T4, the power supply potentials supplied to the wirings 111 and 112 may be switched from the power supply potential VDD to the power supply potential VSS at the same time. Alternatively, the power supply potential supplied to one of the wirings 111 and 112 may be first switched from the power supply potential VDD to the power supply potential VSS.

In the period T5, the supply of the power supply voltage to one of the logic elements 101 and 102 is restarted. Specifically, the switches 103 and 104 are off. The power supply potential supplied to the wiring 111 is switched from the power supply potential VSS to the power supply potential VDD, and the power supply potential VSS is still supplied to the wiring 112. By this operation, the supply of the power supply voltage to the logic element 101 is restarted and the supply of the power supply voltage to the logic element 102 remains stopped.

Alternatively, the power supply potential supplied to the wiring 112 may be switched from the power supply potential VSS to the power supply potential VDD, and the power supply potential VSS may keep being supplied to the wiring 111. In this operation, the supply of the power supply voltage to the logic element 102 is restarted and the supply of the power supply voltage to the logic element 101 remains stopped.

The memory circuits 120 and 121 keep holding the data of the logic elements 101 and 102 that is written in the period T3.

In the period T6, the data held in the memory circuits 120 and 121 is restored to the logic elements 101 and 102. Specifically, the switches 103 and 104 are off. As in the period T5, the power supply potential VDD is supplied to the wiring 111 and the power supply potential VSS is supplied to the wiring 112. Alternatively, as in the period T5, the power supply potential VDD may be supplied to the wiring 112 and the power supply potential VSS is supplied to the wiring 111. Further, the first potential of the signal including the data is read from the memory circuit 120 to be supplied to the input terminal of the logic element 101 and the output terminal of the logic element 102, and the second potential is read from the memory circuit 121 to be supplied to the input terminal of the logic element 102 and the output terminal of the logic element 101. Consequently, the data is written to the logic elements 101 and 102.

Note that in the period T6, since the power supply voltage are supplied to one of the logic elements 101 and 102, one of the potential of the input terminal of the logic element 101 (nodeA) and the potential of the output terminal of the logic element 101 (nodeB) is at a high level and the other is at a low level; that is, the polarities of the potentials are opposite to each other. Since the power supply voltage is not supplied to the other of the logic elements 101 and 102, the level of the potential of the input terminal (nodeA) and the level of the potential of the output terminal (nodeB) are determined as a high level or a low level depending on the data from the memory circuits 120 and 121.

In the period T7, the supply of the power supply voltage to the other of the logic elements 101 and 102, which is stopped in the period T5, is restarted. Specifically, the switches 103 and 104 are off. In the case where the supply of the power supply voltage to the logic element 101 is restarted in the period T5, in the period T7, the power supply potential supplied to the wiring 112 is switched from the power supply potential VSS to the power supply potential VDD and the power supply potential VDD is supplied to the wiring 111. By this operation, the supply of the power supply voltage to not only the logic element 101 but also the logic element 102 is restarted.

Alternatively, in the case where the supply of the power supply voltage to the logic element 102 is restarted in the period T5, in the period T7, the power supply potential supplied to the wiring 111 is switched from the power supply potential VSS to the power supply potential VDD and the power supply potential VDD is supplied to the wiring 112. By this operation, the supply of the power supply voltage to not only the logic element 102 but also the logic element 101 is restarted.

Note that in the period T7, the first potential and the second potential keep being supplied from the memory circuits 120 and 121 to the logic elements 101 and 102 when the supply of the power supply voltage to the other of the logic elements is restarted. Specifically, the state in the period T6 is maintained where the first potential is supplied from the memory circuit 120 to the input terminal of the logic element 101 and the output terminal of the logic element 102 and the second potential is supplied from the memory circuit 121 to the input terminal of the logic element 102 and the output terminal of the logic element 101. After the supply of the power supply voltage to the other of the logic elements is restarted, the supply of the first potential and the second potential from the memory circuits 120 and 121 to the logic elements 101 and 102 is stopped.

By the operation, in the period T7, the data written to the logic elements 101 and 102 in the period T6 is held.

In the period T8, the data held in the logic elements 101 and 102 is read through the wirings 109 and 110. Specifically, the switches 103 and 104 are on. Then, the first potential of the signal including the data is supplied to the wiring 109 from the input terminal of the logic element 101 through the switch 103. The second potential is supplied to the wiring 110 from the input terminal of the logic element 102 through the switch 104.

The power supply potential VDD, which is a high-level potential, is supplied to the wirings 111 and 112. The power supply voltage corresponding to the difference between the power supply potential VSS and the power supply potential VDD is supplied to the logic elements 101 and 102.

Note that in the periods T1, T2, and T8, the memory circuits 120 and 121 may be in either a state where data can be written and read to/from the memory circuits 120 and 121 or a state where the data cannot be written and read to/from the memory circuits 120 and 121.

In a memory device according to one embodiment of the present invention, a power supply voltage supplied to the logic element 101 and a power supply voltage supplied to the logic element 102 are supplied through different paths, so that as in the period T5, the state can be made where the power supply voltage is supplied to one of the logic elements 101 and 102 and the power supply voltage is not supplied to the other when data stored in the memory circuits 120 and 121 is restored to the logic elements 101 and 102. As a result, the following operations can be performed sequentially, not at the same time: an operation in the period T5 in which a power supply voltage is supplied to only one of the logic elements 101 and 102, an operation in the period T6 in which saved data is written to the logic elements 101 and 102, and an operation in the period T7 in which the power supply voltages are supplied to both the logic elements 101 and 102 so that the data is held in the logic elements 101 and 102. Therefore, in the memory device according to one embodiment of the present invention, highly reliable data can be ensured even after the data saved on the memory circuits 120 and 121 is restored to the logic elements 101 and 102.

Next, an example of a specific structure of the memory element 100 in FIG. 1 is described with reference to FIG. 3.

Figure 3:
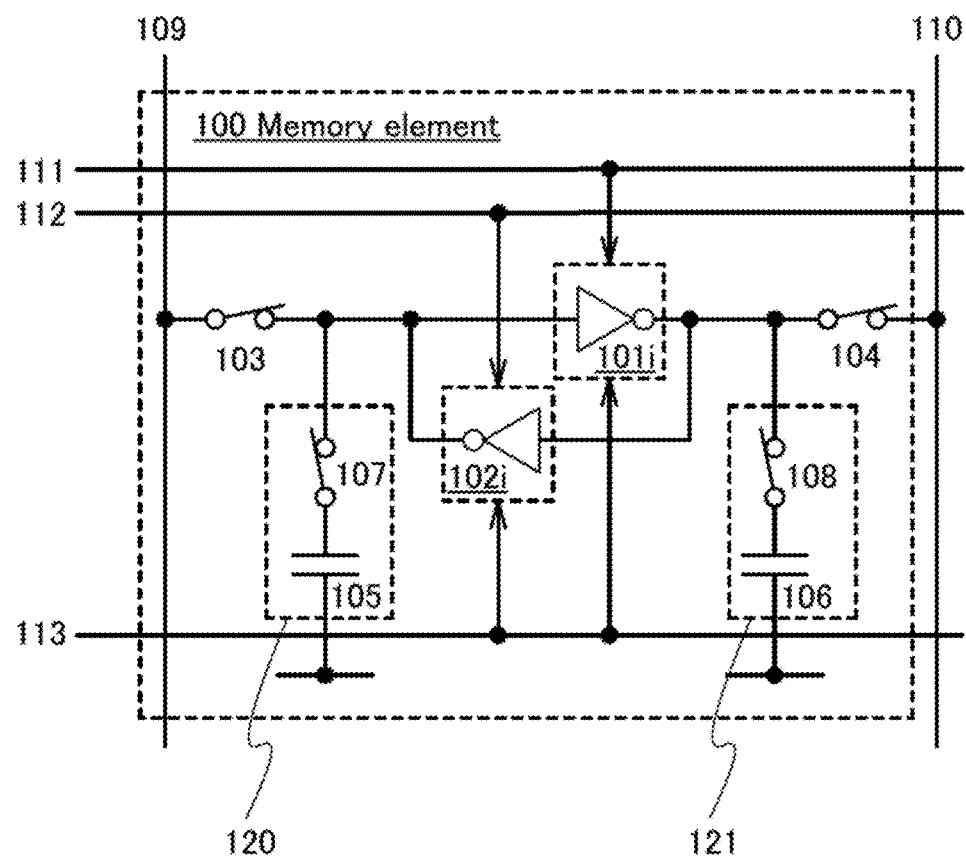
FIG. 3 illustrates a structure of a memory element.

A memory element 100 illustrated in FIG. 3 includes an inverter 101$i$, an inverter 102$i$, a switch 103, a switch 104, a switch 107, a capacitor 105, a switch 108, and a capacitor 106. The inverter 101$i$ corresponds to an example of the logic element 101. The logic element 102 corresponds to an example of the inverter 102$i$. The switch 107 and the capacitor 105 collectively correspond to an example of the memory circuit 120. The switch 108 and the capacitor 106 collectively correspond to an example of the memory circuit 121. An input terminal of the inverter 101$i$ is connected to an output terminal of the inverter 102$i$, and an input terminal of the inverter 102$i$ is connected to an output terminal of the inverter 101$i$.

The supply of power supply voltages enables the inverters 101$i$ and 102$i$ to hold data written through the switch 103 or 104.

The capacitor 105 is connected to the input terminal of the inverter 101$i$ through the switch 107 so as to be able to store data held in the inverters 101$i$ and 102$i$ as needed. The capacitor 106 is connected to the input terminal of the inverter 102$i$ through the switch 108 so as to be able to store the data held in the inverters 101$i$ and 102$i$ as needed.

Specifically, the capacitor 105 includes a dielectric between a pair of electrodes. One of the electrodes is connected to the input terminal of the inverter 101$i$ through the switch 107. The other of the electrodes is connected to a node to which a potential such as a ground potential is supplied. The capacitor 106 includes a dielectric between a pair of electrodes. One of the electrodes is connected to the input terminal of the inverter 102$i$ through the switch 108. The other of the electrodes is connected to a node to which a potential such as a ground potential is supplied.

In one embodiment of the present invention, a transistor having an extremely low off-state current is used for the switches 107 and 108. With such a structure, even when the supply of the power supply voltage to the memory element 100 is stopped, data can be held in the memory circuits 120 and 121 by turning off the switches 107 and 108. As a result, the data held in the inverters 101$i$ and 102$i$ is saved on the memory circuits 120 and 121 before the supply of a power supply voltage to the memory element 100 is stopped, whereby loss of the data can be prevented.

Note that the memory element 100 may also include another circuit element such as a transistor, a diode, a resistor, or an inductor, as needed.

A timing chart in FIG. 4 shows an example of the operation of the memory element 100 illustrated in FIG. 3. According to the timing chart in FIG. 4, as in FIG. 2, operation of the memory element 100 is changed depending on periods (periods T1 to T8). In the periods T1, T2, and T8, data is written, held, and read to/in/from the inverters 101$i$ and 102$i$. In the periods T3 to T7, the supply of power supply voltages to the inverters 101i and 102i is stopped and restarted and the data is saved and restored.

The operation of the memory element 100 in each period, which is illustrated in FIG. 3, will be described below. Note that operations of the switches 103 and 104 and the power supply potential supplied to the wirings 111 and 112 are the same as those shown in the timing chart in FIG. 2 throughout all of the periods. Therefore, in this embodiment, operations of the switches 107 and 108 in each period will be described in detail. The following description is made assuming that a power supply potential VSS which is a low-level potential is always supplied to the wiring 113.

In the periods T1 and T2, the switches 107 and 108 are off. In the periods T1 and T2, the switch 107 or 108 may be on. However, in the case where the switches 107 and 108 are off in the period T1, electric charge is not charged or discharged in/from the capacitors 105 and 106 in writing data to the memory element 100, which achieves high-speed data write to the memory element 100.

In the period T3, the switches 107 and 108 are on. The first potential of the signal including the data is supplied to the one electrode of the capacitor 105 from the input terminal of the inverter 101i and the output terminal of the inverter 102i, and the second potential is supplied to the one electrode of the capacitor 106 from the input terminal of the inverter 102i and the output terminal of the inverter 101i. Consequently, the data is written to the memory circuits 120 and 121. By the operation, electric charge is supplied to the capacitors 105 and 106 through the switches 107 and 108 in accordance with the data held in the inverters 101i and 102i; therefore, the data can be saved on the memory circuits 120 and 121.

In the periods T4 and T5, the switches 107 and 108 are off. By the operation, the electric charge supplied to the capacitors 105 and 106 is held.

In the period T6, the switches 107 and 108 are on. Then, the first potential held in the capacitor 105 is read from the memory circuit 120 and is supplied to the input terminal of the inverter 101i and the output terminal of the inverter 102i. The second potential held in the capacitor 106 is read from the memory circuit 121 and is supplied to the input terminal of the inverter 102i and the output terminal of the inverter 101i. By the operation, data is written to the inverters 101i and 102i.

In the period T6, the inverter 102i does not operate because a power supply voltage is not supplied to the inverter 102i. Therefore, charge or discharge of the capacitor 105 by the inverter 102i does not performed. Accordingly, the data in the capacitor 105 is not lost by a malfunction of the inverter 102i at the time when the supply of the power supply voltage to the inverter 102i is started. On the other hand, the data in the capacitor 106 can be lost by a malfunction of the inverter 101i at the time when the supply of the power supply voltage to the inverter 101i is started. However, since the data is in the capacitor 105, the data in the capacitor 106 is rewritten by the inverter 102i by using the data in the capacitor 105. Specifically, a digital value of the data in the capacitor 105 is inverted by the inverter 102i so that the data is written to the capacitor 106.

In the periods T7 and T8, the switches 107 and 108 are on until the supply of the power supply voltages to the inverters 101i and 102i is restarted. After the supply of the power supply voltages to the inverters 101i and 102i is restarted, the switches 107 and 108 are turned off. Note that the switches 107 and 108 may be on also after the supply of the power supply voltages to the inverters 101i and 102i is restarted. However, in the case where the switches 107 and 108 are off in the period T8, electric charge is not charged or discharged in/from the capacitors 105 and 106 in reading data from the memory element 100; consequently, the data can be read from the memory element 100 at a high speed.

Next, an example of a more specific structure of the memory element 100 in FIG. 3 is described with reference to FIG. 5.

Figure 5:
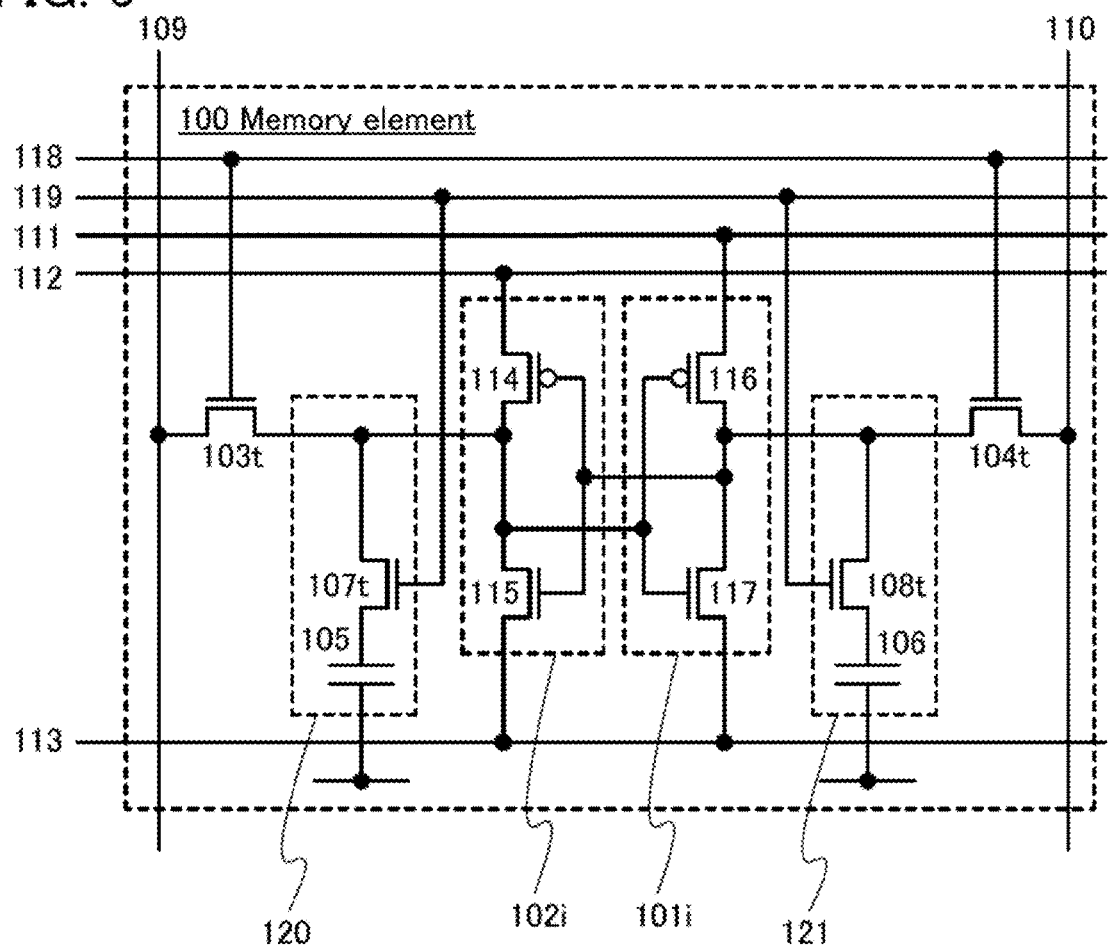
FIG. 5 illustrates a structure of a memory element.

The memory element 100 illustrated in FIG. 5 includes a transistor 103t used as the switch 103, a transistor 104t used as the switch 104, a transistor 107t used as the switch 107, and a transistor 108t used as the switch 108. The transistors 103t and 104t may be n-channel transistors or p-channel transistors, and the transistors 107t and 108t may also be n-channel transistors or p-channel transistors. FIG. 5 illustrates the case where all of the transistors 103t, 104t, 107t, and 108t are n-channel transistors.

In FIG. 5, the inverter 101i includes a p-channel transistor 116 and an n-channel transistor 117, and the inverter 102i includes a p-channel transistor 114 and an n-channel transistor 115.

One of a source terminal and a drain terminal of the transistor 103t is connected to the wiring 109, and the other of the source and drain terminals of the transistor 103t is connected to a gate electrode of the transistor 116 and a gate electrode of the transistor 117. A gate electrode of the transistor 103t is connected to a wiring 118. One of a source terminal and a drain terminal of the transistor 104t is connected to the wiring 110, and the other of the source and drain terminals of the transistor 104t is connected to a gate electrode of the transistor 114 and a gate electrode of the transistor 115. A gate electrode of the transistor 104t is connected to the wiring 118.

Note that a "source terminal" of a transistor means a source region that is part of an active layer or a source electrode that is connected to an active layer. Similarly, "drain terminal" of a transistor means a drain region that is a part of an active layer or a drain electrode connected to an active layer.

One of a source terminal and a drain terminal of the transistor 107t is connected to the gate electrode of the transistor 116 and the gate electrode of the transistor 117, and the other of the source and drain terminals of the transistor 107t is connected to the one electrode of the capacitor 105. A gate electrode of the transistor 107t is connected to a wiring 119. One of a source terminal and a drain terminal of the transistor 108t is connected to the gate electrode of the transistor 114 and the gate electrode of the transistor 115, and the other of the source and drain terminals of the transistor 108t is connected to the one electrode of the capacitor 106. A gate electrode of the transistor 108t is connected to the wiring 119.

One of a source terminal and a drain terminal of the transistor 114 is connected to the wiring 112, and the other of the source and drain terminals of the transistor 114 is connected to the gate electrode of the transistor 116 and the gate electrode of the transistor 117. One of a source terminal and a drain terminal of the transistor 115 is connected to the wiring 113, and the other of the source and drain terminals of the transistor 115 is connected to the gate electrode of the transistor 116 and the gate electrode of the transistor 117. One of a source terminal and a drain terminal of the transistor 116 is connected to the wiring 111, and the other of the source and drain terminals of the transistor 116 is connected to the gate electrode of the transistor 114 and the gate electrode of the transistor 115. One of a source terminal and a drain terminal of the transistor 117 is connected to the wiring 113, and the other of the source and drain of the transistor 117 is connected to the gate electrode of the transistor 114 and the gate electrode of the transistor 115.

With this structure, the gate electrode of the transistor 116 and the gate electrode of the transistor 117 function as input terminals of the inverter 101*i*. The other of the source and drain terminals of the transistor 116 and the other of the source and drain terminals of the transistor 117 function as the output terminals of the inverter 101*i*. In the inverter 102*i* with this structure, the gate electrode of the transistor 114 and the gate electrode of the transistor 115 function as its input terminals. In the inverter 102*i*, the other of the source and drain terminals of the transistor 114 and the other of the source and drain terminals of the transistor 115 function as its output terminals.

Note that the memory element 100 may also include another circuit element such as a transistor, a diode, a resistor, or an inductor, as needed.

FIG. 5 illustrates an example in which each switch is formed using one transistor, but the present invention is not limited to this structure. In one embodiment of the present invention, a plurality of transistors may function as one switch. In the case where the plurality of transistors function as one switch, the plurality of transistors may be connected to each other in parallel, in series, or in combination of a parallel connection and a series connection.

Note that in this specification, the state in which first and second transistors are connected to each other in series means the state in which only one of source and drain terminals of the first transistor is connected to only one of source and drain terminals of the second transistor. In addition, the state in which the transistors are connected to each other in parallel means the state in which one of source and drain terminals of a first transistor is connected to one of source and drain terminals of a second transistor and the other of the source and drain terminals of the first transistor is connected to the other of the source and drain terminals of the second transistor.

The terms "source terminal" and "drain terminal" of a transistor interchange with each other depending on the type of the channel of the transistor or levels of potentials supplied to the source and drain terminals. In general, as for a source terminal and a drain terminal in an n-channel transistor, one to which a lower potential is supplied is called a source terminal, and one to which a higher potential is supplied is called a drain terminal. Further, as for a source terminal and a drain terminal in a p-channel transistor, one to which a lower potential is supplied is called a drain terminal, and one to which a higher potential is supplied is called a source terminal. In this specification, although the connection relation of the transistor is described assuming that the source terminal and the drain terminal are fixed in some cases for convenience, actually, the names of the source terminal and the drain terminal interchange with each other depending on the relation of the potentials.

Although FIG. 5 illustrates the example of the case where the transistor functioning as the switch has a single-gate structure, the transistor may have a multi-gate structure in which a plurality of electrically connected gate electrodes are included so that a plurality of channel formation regions are included.

Figure 6:
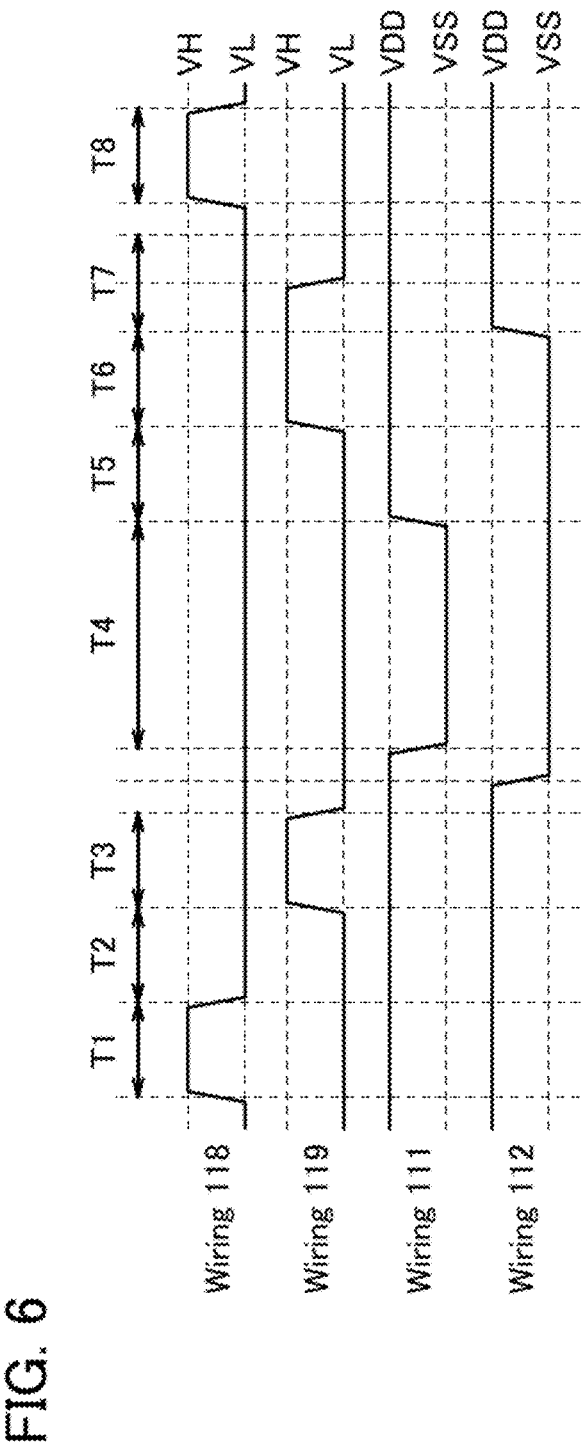
FIG. 6 is a timing chart.

A timing chart in FIG. 6 shows an example of operation of the memory element 100 illustrated in FIG. 5. FIG. 6 shows a change in the potentials of the wirings 111, 112, 118, and 119 over time on the assumption that all of the transistors 103*t*, 104*t*, 107*t*, and 108*t* are n-channel transistors. According to the timing chart in FIG. 6, as in FIG. 2, operation of the memory element 100 is changed depending on periods (periods T1 to T8). In the periods T1, T2, and T8, data is written, held, and read to/in/from the inverters 101*i* and 102*i*. In the periods T3 to T7, the supply of power supply voltages to the inverters 101*i* and 102*i* is stopped and restarted and the data is saved and restored.

Operations of the memory element 100 in FIG. 5 in each period will be described below in detail. Note that the following description is made assuming that a power supply potential VSS is always supplied to the wiring 113.

In the period T1, the transistors 103*t* and 104*t* are on because the high-level potential VH is supplied to the wiring 118. Therefore, data of the wirings 109 and 110 is written to the inverters 101*i* and 102*i*. The transistors 107*t* and 108*t* are off because the low-level potential VL is supplied to the wiring 119. The power supply potential VDD is supplied to the wirings 111 and 112. The power supply voltage corresponding to the difference between the power supply potential VSS and the power supply potential VDD is supplied to the inverters 101*i* and 102*i*.

In the period T2, the transistors 103*t* and 104*t* are off because the potential VL is supplied to the wiring 118. Accordingly, the inverters 101*i* and 102*i* hold the data. In addition, the transistors 107*t* and 108*t* are off because the potential VL is supplied to the wiring 119. The power supply potential VDD is supplied to the wirings 111 and 112. The power supply voltage corresponding to the difference between the power supply potential VSS and the power supply potential VDD is supplied to the inverters 101*i* and 102*i*.

In the period T3, the transistors 103*t* and 104*t* are off because the potential VL is supplied to the wiring 118. In addition, the transistors 107*t* and 108*t* are on because the potential VH is supplied to the wiring 119. Therefore, the data of the inverters 101*i* and 102*i* is written to the capacitors 105 and 106. The power supply potential VDD is supplied to the wirings 111 and 112. The power supply voltage corresponding to the difference between the power supply potential VSS and the power supply potential VDD is supplied to the inverters 101*i* and 102*i*.

In the period T4, the transistors 103*t* and 104*t* are off because the potential VL is supplied to the wiring 118. In addition, the transistors 107*t* and 108*t* are off because the potential VL is supplied to the wiring 119. The supply of the power supply voltages to the inverters 101*i* and 102*i* is stopped because the power supply potential VSS is supplied to the wirings 111 and 112. Therefore, off-state current of the transistors 114 and 115 enables the amount of current flowing between the wiring 112 and the wiring 113 to be close to zero. In addition, off-state current of the transistors 116 and 117 enables the amount of current flowing between the wiring 111 and the wiring 113 to be close to zero. Leakage power caused by off-state current of the transistors included in the inverters 101*i* and 102*i* can be made to be close to zero. Further, when off-state current of the transistors 107*t* and 108*t* is sufficiently low, the data in the capacitors 105 and 106 keeps being held after the supply of the power supply voltages to the inverters 101*i* and 102*i* is stopped.

Note that unless otherwise specified, in this specification, off-state current of an n-channel transistor is current that flows between a source terminal and a drain terminal when the voltage of the drain terminal is higher than that of the source terminal or that of a gate electrode while the voltage of the gate electrode is 0 V or lower in the case of the voltage of the source terminal used as a reference. Alternatively, in this specification, off-state current of a p-channel transistor is current that flows between a source terminal and a drain terminal when the voltage of the drain terminal is lower than that of the source terminal or that of a gate electrode while the voltage of the gate electrode is 0 V or higher in the case of the voltage of the source terminal used as a reference.

According to the timing chart in FIG. 6, in moving from the period T3 to the period T4, the power supply potential supplied to the wiring 112 is switched from the power supply potential VDD to the power supply potential VSS, and then, the power supply potential supplied to the wiring 111 is switched from the power supply potential VDD to the power supply potential VSS. In one embodiment of the present invention, the power supply potential supplied to the wiring 111 and the power supply potential supplied to the wiring 112 may be switched from the power supply potential VDD to the power supply potential VSS at the same time. Alternatively, in one embodiment of the present invention, the power supply potential supplied to the wiring 111 may be switched from the power supply potential VDD to the power supply potential VSS before the power supply potential supplied to the wiring 112 is switched from the power supply potential VDD to the power supply potential VSS.

In the period T5, the transistors 103t and 104t are off because the potential VL is supplied to the wiring 118. In addition, the transistors 107t and 108t are off because the potential VL is supplied to the wiring 119. The supply of the power supply voltage to the inverter 101i is restarted because the power supply potential VDD is supplied to the wiring 111. The supply of the power supply voltage to the inverter 102i is stopped because the power supply potential VSS is supplied to the wiring 112.

In the period T6, the transistors 103t and 104t are off because the potential VL is supplied to the wiring 118. In addition, the transistors 107t and 108t are on because the potential VH is supplied to the wiring 119. The power supply voltage is supplied to the inverter 101i because the power supply potential VDD is supplied to the wiring 111. The supply of the power supply voltage to the inverter 102i is stopped because the power supply potential VSS is supplied to the wiring 112.

In the period T7, the transistors 103t and 104t are off because the potential VL is supplied to the wiring 118. In addition, the potential supplied to the wiring 119 is changed from the potential VH to the potential VL, and therefore, the transistors 107t and 108t are turned off. The power supply voltage is supplied to the inverter 101i because the power supply potential VDD is supplied to the wiring 111. The supply of the power supply voltage to the inverter 102i is restarted because the power supply potential VDD is supplied to the wiring 112.

According to the timing chart shown in FIG. 6, the supply of the power supply voltage to the inverter 101i is restarted in the period T5 and the supply of the power supply voltage to the inverter 102i is restarted in the period T7. However, the supply of the power supply voltage to the inverter 102i may be restarted in the period T5 and the supply of the power supply voltage to the inverter 101i may be restarted in the period T7. In this case, in the periods T5 and T6, the power supply potential VSS is supplied to the wiring 111 and the power supply potential VDD is supplied to the wiring 112.

In the period T8, the transistors 103t and 104t are on because the high-level potential VH is supplied to the wiring 118. The transistors 107t and 108t are off because the low-level potential VL is supplied to the wiring 119. The power supply potential VDD is supplied to the wirings 111 and 112. The power supply voltage corresponding to the difference between the power supply potential VSS and the power supply potential VDD is supplied to the inverters 101i and 102i.

Note that in the periods T1, T2, and T8, the memory circuits 120 and 121 may be in either a state where data can be written and read to/from the memory circuits 120 and 121 or a state where the data cannot be written and read to/from the memory circuits 120 and 121. That is, in the periods T1, T2, and T8, the high-level potential VH may be supplied to the wiring 119.

In the memory element 100 illustrated in FIG. 5, the transistor 107t is turned off to hold electric charge in the capacitor 105, and the transistor 108t is turned off to hold electric charge in the capacitor 106. Therefore, the transistors 107t and 108t preferably have a low off-state current. By using the transistors 107t and 108t with a low off-state current as the switches 107 and 108, the amount of electric charge leaking from the capacitors 105 and 106 can be small, and therefore, data can be surely held in the memory circuits 120 and 121.

A transistor having a channel formation region containing a semiconductor that has a wide band gap and is highly purified by reducing impurities such as moisture and hydrogen, which function as electron donors (donors), and oxygen defects has an extremely low off-state current. Using the transistor as the transistors 107t and 108t enables data to be surely held in the memory circuits 120 and 121.

Note that each of the transistors 103t, 104t, and 114 to 117 may be either a transistor whose channel formation region contains a semiconductor having a wide band gap, such as an oxide semiconductor, or a transistor whose channel formation region contains a crystalline semiconductor such as silicon or germanium. A transistor whose channel formation region contains a semiconductor such as silicon or germanium has a high mobility. Using the transistor as the transistors 103t, 104t, and 114 to 117 enables data to be read and written from/to the memory element 100 at a high speed.

In the case where the transistors 103t, 104t, and 114 to 117 are each a transistor whose channel formation region contains a semiconductor such as silicon or germanium and the transistors 107t and 108t are each a transistor whose channel formation region contains an oxide semiconductor, stacking the transistors 103t, 104t, 114 to 117, 107t, and 108t enables high integration of the memory device.

Note that the memory element 100 having the structure in FIG. 3 and FIG. 5 has a smaller overhead than a memory element using an MRAM or the like for a memory circuit. Specifically, writing current per cell of an MRAM is said to be 50 µA to 500 µA. On the other hand, in the memory element 100 having the structure in FIG. 3 and FIG. 5, data is saved by supplying electric charge to a capacitor. Consequently, a current needed for data write can be approximately 1/100 of that of an MRAM or the like. Therefore, in one embodiment of the present invention which has the structure in FIG. 3 and FIG. 5, BET can be short because overhead needed for stopping the supply of power can be smaller than that in the case of an MRAM. As a result, power consumption of a semiconductor device according to one embodiment of the present invention which uses the memory device and can be lower than that in the case of using an MRAM.

Figure 7A:
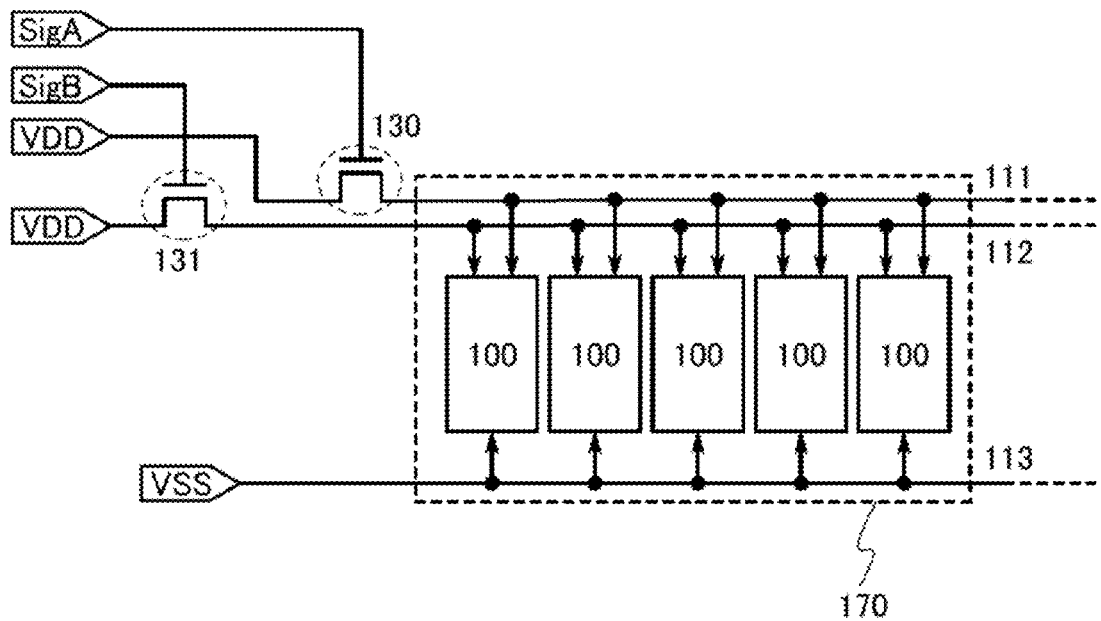
FIGS. 7A and 7B each illustrate a structure of a memory device.

Next, FIG. 7A illustrates a structure example of a memory device. The memory device illustrated in FIG. 7A includes a switch 130, a switch 131, and a memory element group 170 which includes a plurality of memory elements 100. The power supply potential VDD supplied to the wiring 111 through the switch 130 is supplied to each of the memory elements 100. In addition, the power supply potential VDD supplied to the wiring 112 through the switch 131 is supplied to each of the memory elements 100. Further, the power supply potential VSS is supplied to each of the memory elements 100 through the wiring 113.

FIG. 7A illustrates the case where one transistor is used as each of the switches 130 and 131. Switching of the switch 130 and switching of the switch 131 are controlled by a signal SigA and the signal SigB, respectively. The switches 130 and 131 enable control of the supply of the power supply potential VDD to each of the memory elements 100 through two paths.

FIG. 7A illustrates the case where each of the memory elements 100 is supplied with the power supply potential VDD through two paths. However, the memory device according to one embodiment of the present invention may have a structure in which each of the memory elements 100 is supplied with the power supply potential VSS through two paths.

Figure 7B:
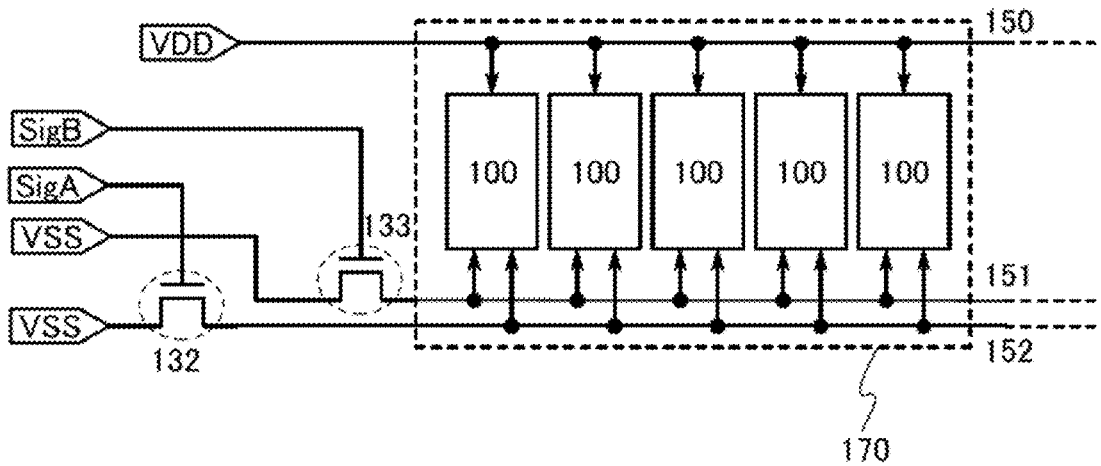

The memory device illustrated in FIG. 7B includes a switch 132, a switch 133, and a memory element group 170 which includes a plurality of memory elements 100. A power supply potential VSS supplied to a wiring 152 through the switch 132 is supplied to each of the memory elements 100. In addition, the power supply potential VSS supplied to a wiring 151 through the switch 133 is supplied to each of the memory elements 100. Further, a power supply potential VDD is supplied to each of the memory elements 100 through a wiring 150.

FIG. 7B illustrates the case where one transistor is used as each of the switches 132 and 133. Switching of the switch 132 and switching of the switch 133 are controlled by a signal SigA and the signal SigB, respectively. The switches 132 and 133 enable each of the memory elements 100 to be supplied with the power supply potential VSS through two paths.

(Embodiment 2)

Figure 8:
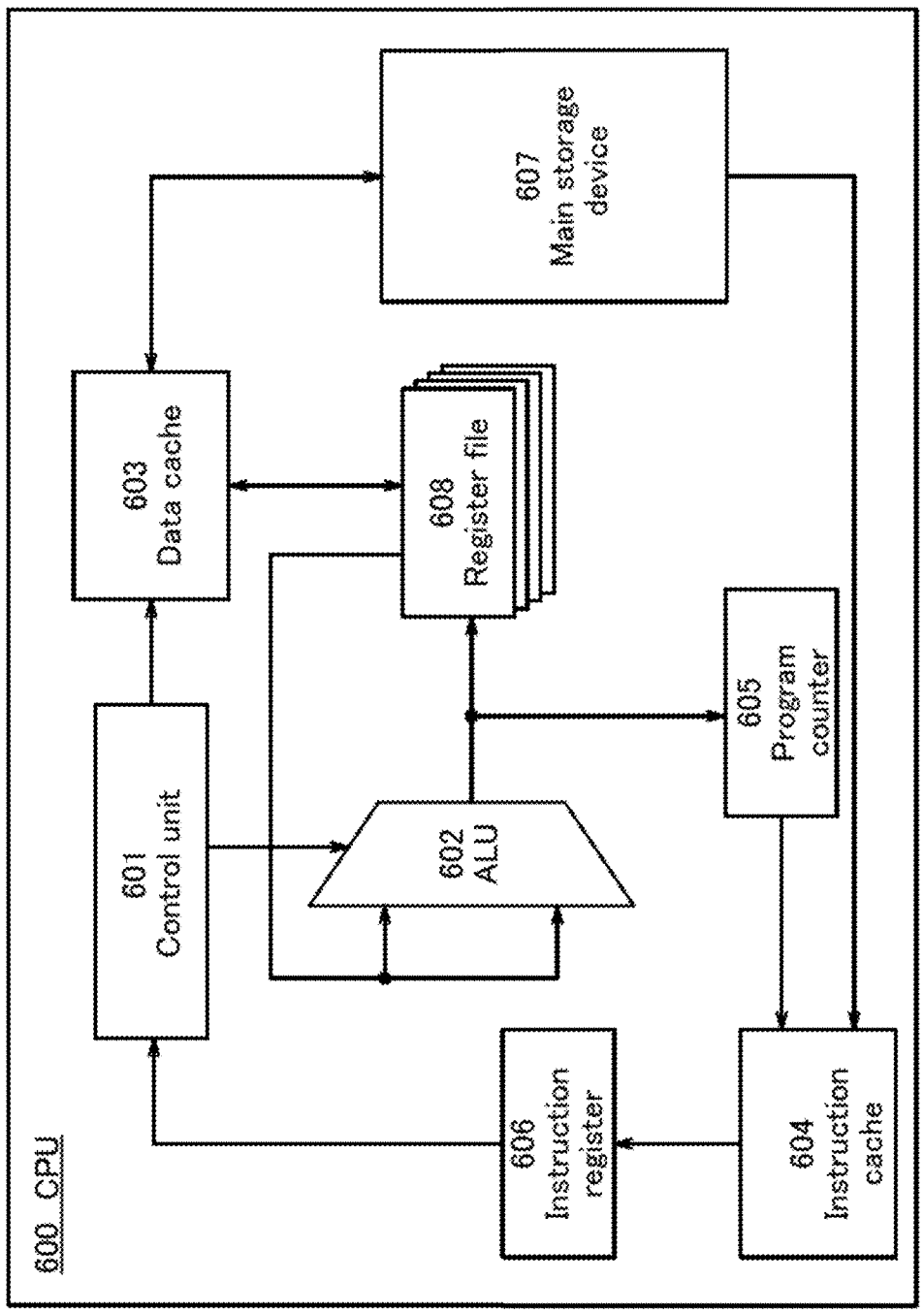
FIG. 8 illustrates a structure of a CPU.

In this embodiment, a specific embodiment of a CPU corresponding to one mode of a semiconductor device of the present invention will be described. FIG. 8 is a block diagram illustrating a structure example of a CPU. Although the block diagram attached this specification shows elements classified according to their functions in independent blocks, it may be practically difficult to completely separate the elements according to their functions and, in some cases, one element may be involved in a plurality of functions.

A CPU 600 includes a controller 601, an arithmetic logic unit (ALU) 602 corresponding to an arithmetic unit, a data cache 603, an instruction cache 604, a program counter 605, an instruction register 606, a main storage device 607, and a register file 608.

The control unit 601 has functions of decoding and executing an input instruction. The ALU 602 has a function of performing a variety of arithmetic operations such as four arithmetic operations and logic operations. The data cache 603 is a buffer storage device which temporarily stores frequently used data. The instruction cache 604 is a buffer storage device which temporarily stores frequently used instructions of instructions (programs) sent to the control unit 601. The program counter 605 is a register which stores an address of an instruction to be executed next. The instruction register 606 is a register which stores an instruction to be executed next. The main memory device 607 stores data used for the arithmetic operations in the ALU 602 and an instruction which is executed in the control unit 601. The register file 608 includes a plurality of registers including a general purpose register and can store data which is read out from the main memory device 607, data which is obtained during the arithmetic operations in the ALU 602, data which is obtained as a result of the arithmetic operations in the ALU 602, and the like.

Next, the operation of the CPU 600 will be described.

The control unit 601 reads an instruction from an address of the instruction cache 604 corresponding to the address of the instruction to be executed next which is stored in the program counter 605, and makes the instruction register 606 store the instruction. When the instruction is not stored in the corresponding address of the instruction cache 604, the control unit 601 gets access to a corresponding address of the main memory device 607, reads the instruction from the main memory device 607, and makes the instruction register 606 store the instruction. In this case, the instruction is also stored in the instruction cache 604.

The control unit 601 decodes the instruction stored in the instruction register 606 and executes the instruction. Specifically, the control unit 601 generates various signals for controlling the operation of the ALU 602 in accordance with the instruction.

When the instruction which is to be executed is an arithmetic instruction, the control unit 601 makes the ALU 602 perform arithmetic operations using the data stored in the register file 608, and stores a result of the arithmetic operations in the register file 608.

When the instruction which is to be executed is a loading instruction, the control unit 601, first, gets access to a corresponding address of the data cache 603, and checks whether or not a corresponding data exists in the data cache 603. When the corresponding data exists in the data cache 603, the data is copied from the corresponding address of the data cache 603 to the register file 608. When the corresponding data does not exist in the data cache 603, the data is copied from a corresponding address of the main memory device 607 to the corresponding address of the data cache 603, and then the data is copied from the corresponding address of the data cache 603 to the register file 608. Note that in the case where the corresponding data does not exist, since it is necessary to get access to the low-speed main memory device 607 as described above, it takes long time to execute the instruction as compared to the case where the control unit gets access only to the buffer storage device such as the data cache 603. However, when not only the above data but also the address of the data and data of addresses of the vicinities of the address in the main memory device 607 are copied to the buffer storage device, the subsequent accesses to the address of the data and the addresses of the vicinities thereof in the main memory device 607 can be performed at a high speed.

When the instruction which is to be executed is a store instruction, the control unit 601 stores data of the register file 608 in a corresponding address of the data cache 603. In this case, the control unit 601, first, gets access to the corresponding address of the data cache 603 and checks whether or not the corresponding data can be stored in the data cache 603. When the data can be stored in the data cache 603, the data is copied from the register file 608 to the corresponding address of the data cache 603. When the data cannot be stored, a new corresponding address is assigned in part of the data cache 603, and the data is copied from the register file 608 to the corresponding address of the data cache 603. Note that the data may be copied to the main memory device 607 immediately after the data is copied to the data cache 603. Alternatively, some pieces of data may be copied to the data cache 603 and then the pieces of data may be collectively copied to the main memory device 607.

Then, after the control unit 601 executes the instruction, the control unit 601 gets access to the program counter 605 again, and repeats the above operation in which an instruction read out from the instruction register 606 is decoded and executed.

In one embodiment of the present invention, when the storage device described in the above embodiment is supplied to the buffer storage device (e.g., the data cache 603 or the instruction cache 604), data in the buffer storage device can be prevented from being lost due to the stop of the supply of power supply voltage. Further, data held before the stop of the supply of power supply voltage can be saved in a short time, and the data can be restored in a short time after the supply of power supply voltage is restarted. Thus, in the entire CPU 600 or the circuits included in the CPU 600, the supply of power supply voltage can be stopped even for a time as long as 60 seconds, or as short as several milliseconds. Thus, power consumption of the CPU 600 can be low.

Figure 9:
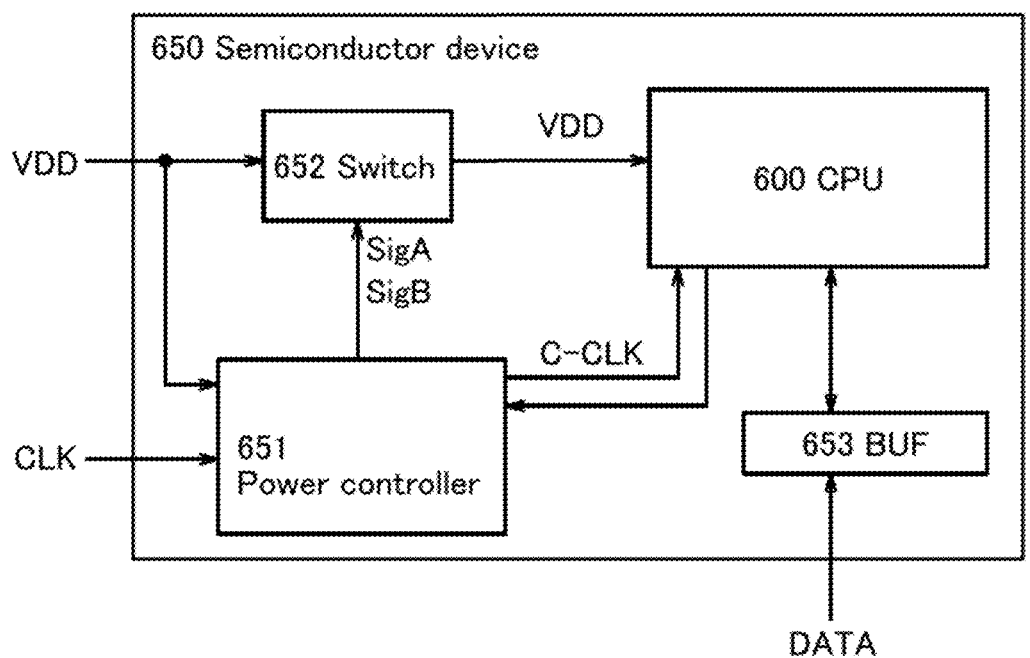
FIG. 9 illustrates a structure of a semiconductor device.

Next, FIG. 9 illustrates the structure of a semiconductor device 650 including the CPU 600 as an example. The semiconductor device 650 illustrated in FIG. 9 includes the CPU 600, a power controller 651, a switch 652, and a BUF (buffer) 653.

The CPU 600 has a function of totally controlling operations of the power controller 651 and the BUF 653. The BUF 653 has a function of supplying data input to the semiconductor device 650 to the CPU 600.

The power controller 651 has a function of controlling the supply of a power supply voltage and a driving signal to the CPU 600 in accordance with an instruction from the CPU 600. The CPU 600 is activated by the supply of a power supply voltage and a driving signal from the power controller 651. In addition, the CPU 600 is inactivated by stopping the supply of the power supply voltage and the driving signal from the power controller 651.

Specifically, the power controller 651 has a function of generating the signals SigA and SigB for controlling switching of the switch 652. The switch 652 becomes on or off in accordance with the signals SigA and SigB. When the switch 652 is on, a power supply potential (in FIG. 9, shown as a power supply potential VDD as an example) is supplied to the CPU 600 through the switch 652. When the switch 652 is off, the power supply potential is not supplied to the CPU 600.

The switch 652 includes, for example, the switches 130 and 131 illustrated in FIG. 7A or the switches 132 and 133 illustrated in FIG. 7B.

The driving signals of the CPU 600 includes a clock signal C-CLK and the like. The power controller 651 has a function of generating the clock signal C-CLK used for the CPU 600 from a clock signal CLK which is input to the semiconductor device 650.

Next, an example of operation of the semiconductor device 650 illustrated in FIG. 9 will be described.

In order to stop the supply of a power supply voltage, first, the CPU 600 instructs the power controller 651 to stop the supply of a power supply voltage and a driving signal to the CPU 600. Then, the power controller 651 turns off the switch 652 with the signals SigA and SigB in response to the instruction, so that the supply of the power supply voltage to the CPU 600 is stopped. Specifically, in one embodiment of the present invention, first, data is saved on a memory circuit in the buffer storage device in the CPU 600. Next, the supply of the clock signal C-CLK to the CPU 600 is stopped, and then, supplies of the power supply voltage to the buffer storage device through two paths are both stopped.

When the power controller 651 stops the supply of the power supply voltage and the driving signal to the CPU 600, the CPU 600 is inactivated.

Note that the supply of the driving signal to the CPU 600 may be stopped after the stop of the supply of the power supply voltage to the CPU 600. However, it is preferable that the supply of the power supply voltage to the CPU 600 be stopped after the stop of the supply of the driving signal to the CPU 600, because the CPU 600 can be inactivated without malfunctioning.

When instructions are input to the semiconductor device 650, the supply of the power supply voltage is restarted by the power controller 651. The power controller 651 restarts the supply of the power supply voltage and the driving signal to the CPU 600 in response to the input of the instructions.

Specifically, first, the power controller 651 restarts one of supplies of the power supply voltage to the buffer storage device through two paths. Next, in the buffer storage device in the CPU 600, the data saved on the memory circuit is written to a logic element to be restored. After that, the other of the supplies of the power supply voltage to the buffer storage device through two paths is restarted. Then, the supply of the clock signal C-CLK to the CPU 600 is restarted. The supply of the power supply voltage and the driving signal is restarted, so that the CPU 600 is activated again.

Note that the supply of the power supply voltage to the CPU 600 may be restarted after the supply of the driving signal to the CPU 600 is restarted. However, in the case where the supply of the driving signal to the CPU 600 is restarted after the supply of the power supply voltage to the CPU 600 is restarted, the CPU 600 can be inactivated without malfunctioning.

Instead of a system in which the CPU 600 controls the power controller 651 as described above, the operation of the power controller 651 can be controlled by a power supply control program connected with software, i.e., a basic input/output system (BIOS) or an operating system.

For example, when the BIOS senses the state where the CPU 600 does not fetch a new instruction, the BIOS makes the power controller 651 output an instruction to turn off the switch 652.

In addition, in the case where the semiconductor device 650 is mounted on a computer, the power controller 651 may be controlled by a power supply control program running on an operating system. The power supply control program detects an operation state of the CPU 600 or the state where an input device such as a hard disc or a keyboard is not active for a predetermined period, and then gives an instruction the power controller 651 to turn off the switch 652. Alternatively, instead of the power supply control program, a function key can be set so that a user can input a signal for controlling the operation of the power controller 651 on the basis of the user's intention.

Figure 10:
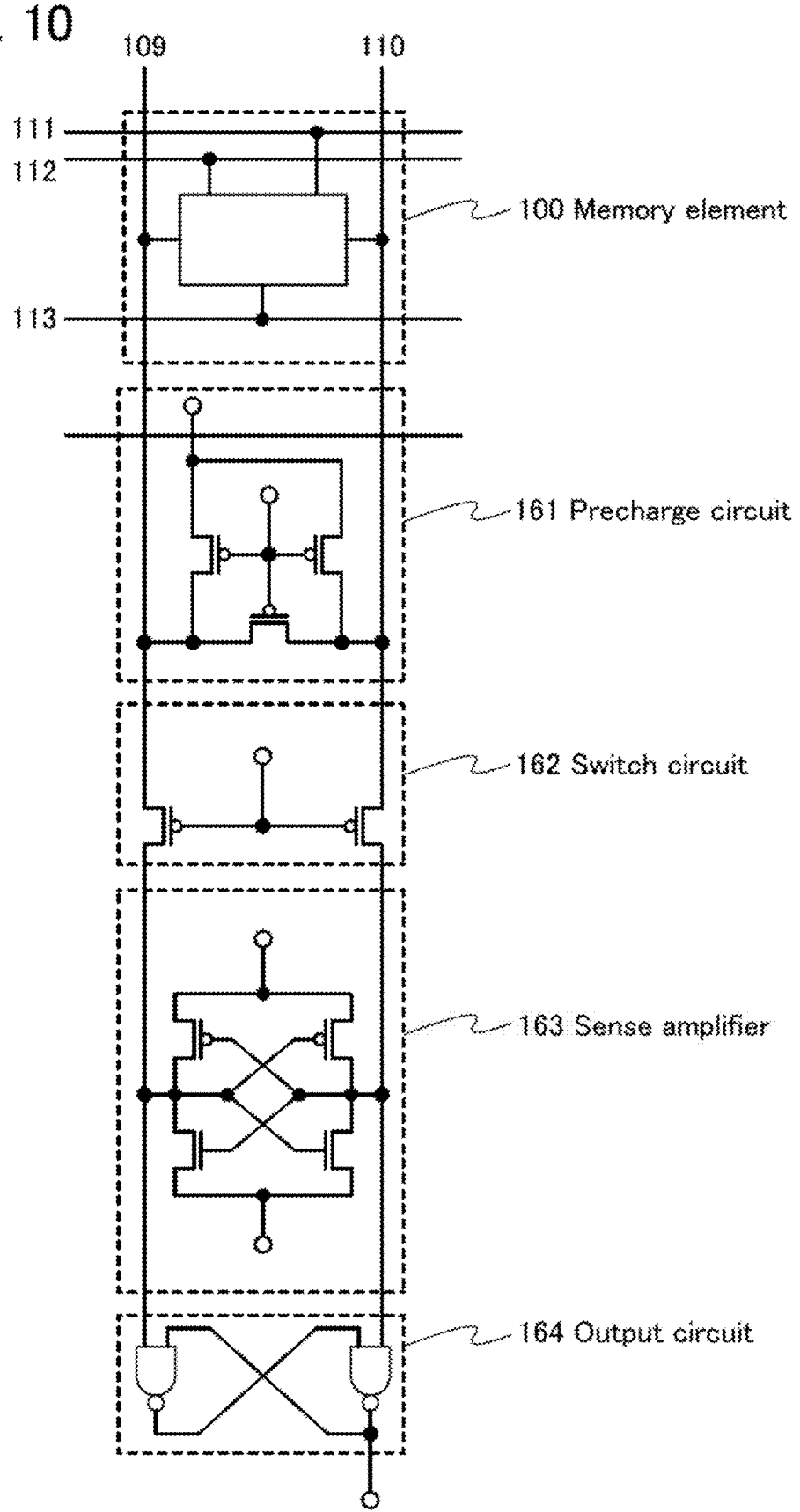
FIG. 10 illustrates a structure of a memory device.

Then, FIG. 10 illustrates a connection between a precharge circuit 161, a switch circuit 162, a sense amplifier 163, and an output circuit 164 which are shared by memory elements 100 in one column. FIG. 10 shows the memory element 100 in FIG. 1 as an example.

The precharge circuit 161 has a function of resetting the potentials of the wirings 109 and 110 before data read. The switch circuit 162 has a function of controlling a connection between each of the wirings 109 and 110 connected to the memory element 100 and both of the sense amplifier 163 and the output circuit 164.

The sense amplifier 163 has a function of amplifying a potential difference between the wiring 109 and the wiring 110 in reading data from the memory element 100. Further, the sense amplifier 163 has a function of temporarily storing the data read from the memory element 100. The output circuit 164 has a function of reading the data by using the potential difference amplified by the sense amplifier 163.

This embodiment can be combined with any of the other embodiments as appropriate.

(Embodiment 3)

In this embodiment, an example of a cross sectional structure of a memory device that includes the memory element 100 illustrated in FIG. 5 will be described. Note that in this embodiment, the case where the transistors 103t, 104t, and 114 to 117 each include an active layer containing an amorphous, microcrystalline, polycrystalline, or single crystal semiconductor (e.g., silicon or germanium) and the transistors 107t and 108t each include an active layer containing an oxide semiconductor is given as an example to describe a cross sectional structure of the memory element 100.

As a silicon, any of the following can be used: amorphous silicon manufactured by a vapor phase growth method such as a plasma CVD method, or a sputtering method; polycrystalline silicon obtained in such a manner that amorphous silicon is crystallized by treatment such as laser annealing; single crystal silicon obtained in such a manner that implantation of hydrogen ions or the like into a silicon wafer is performed and a surface portion of the single crystal silicon wafer is separated; and the like.

Figure 11:
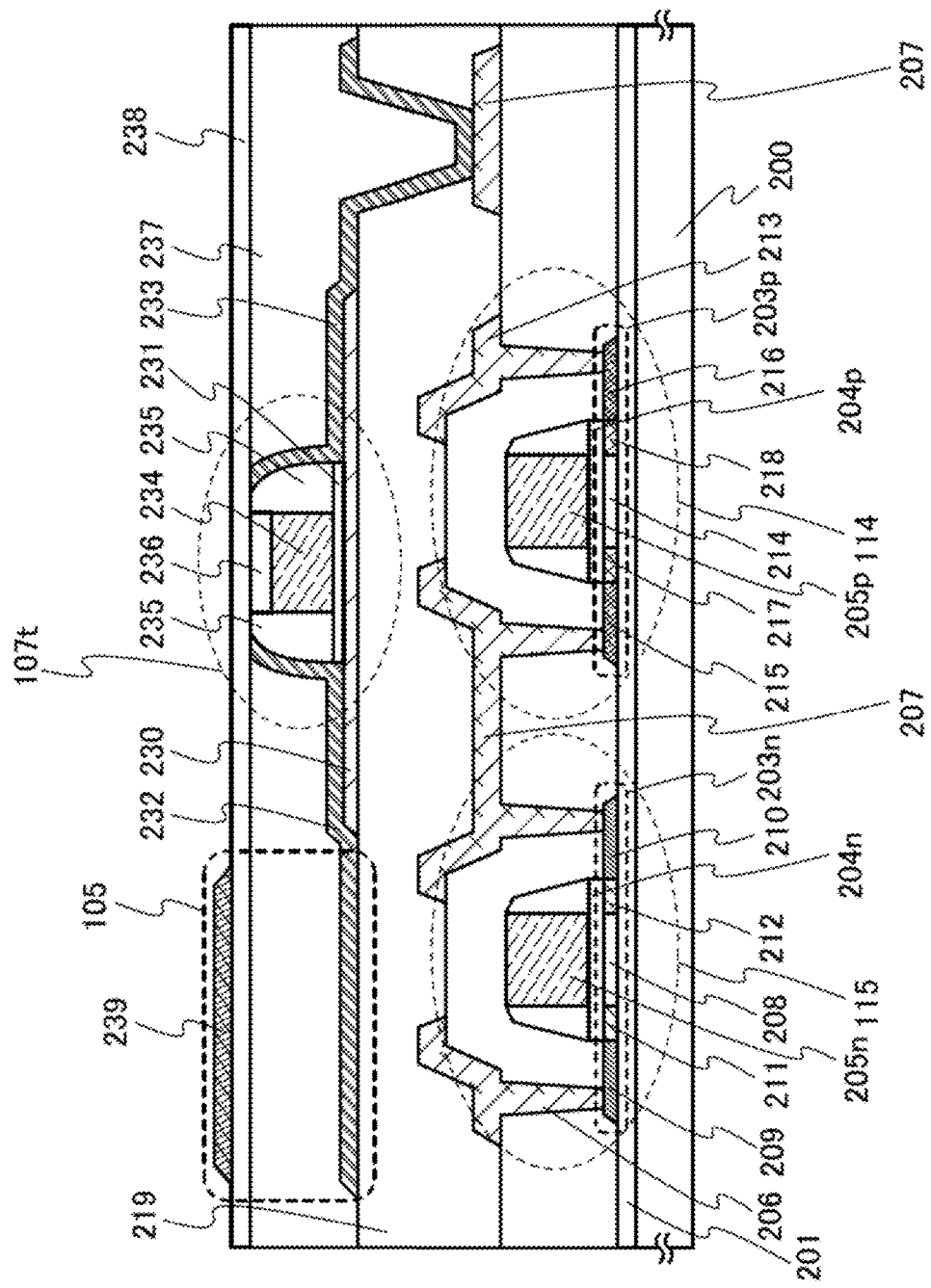
FIG. 11 is a cross sectional view of a memory device.

FIG. 11 shows a cross-sectional view as an example of structures of the p-channel transistor 114, the n-channel transistor 115, the capacitor 105, and the transistor 107t.

The memory device illustrated in FIG. 11 includes the transistor 115 and the transistor 114 over a substrate 200 over the surface of which an insulating film 201 is formed.

The transistor 115 includes a semiconductor film 203n containing silicon having crystallinity, the gate insulating film 204n over the semiconductor film 203n, a gate electrode 205n overlapping the semiconductor film 203n with the gate insulating film 204n laid therebetween, and conductive films 206 and 207 which are connected to the semiconductor film 203n. The semiconductor film 203n includes a first region 208 serving as a channel formation region and second regions 209 and 210 serving as a source region and a drain region. The first region 208 is sandwiched between the second regions 209 and 210. Note that FIG. 11 illustrates the case where the semiconductor film 203n includes third regions 211 and 212 serving as lightly doped drain (LDD) regions between the first region 208 and the second region 209 and between the first region 208 and the second region 210, respectively.

The transistor 114 includes a semiconductor film 203p containing silicon having crystallinity, the gate insulating film 204p over the semiconductor film 203p, a gate electrode 205p overlapping the semiconductor film 203p with the gate insulating film 204p laid therebetween, and conductive films 207 and 213 which are connected to the semiconductor film 203p. The semiconductor film 203p includes a first region 214 serving as a channel formation region and second regions 215 and 216 serving as a source region and a drain region. The first region 214 is sandwiched between the second regions 215 and 216. Note that FIG. 11 illustrates the case where the semiconductor film 203p includes third regions 217 and 218 serving as LDD regions between the first region 214 and the second region 215 and between the first region 214 and the second region 216, respectively.

Note that FIG. 11 illustrates the case where the transistors 115 and 114 share the conductive film 207.

Further, FIG. 11 illustrates the case where the transistor 115 and 114 each include a thin semiconductor film; however, the transistors 115 and 114 may each have a channel formation region in a bulk semiconductor substrate. For the thin semiconductor film, for example, polycrystalline silicon obtained by crystallization of amorphous silicon with the use of a laser, single crystal silicon obtained in such a manner that hydrogen ions or the like are implanted into a single crystal silicon wafer and a surface portion of the single crystal silicon wafer is separated, and the like can be used.

In the memory device illustrated in FIG. 11, an insulating film 219 is formed over the conductive film 206, the conductive film 207, and the conductive film 213. The transistor 107t is provided over the insulating film 219.

The transistor 107t includes a semiconductor film 230 and a gate insulating film 231 over the insulating film 219. The semiconductor film 230 contains an oxide semiconductor. The gate insulating film 231 is provided over the semiconductor film 230. Note that the gate insulating film 231 does not completely cover the semiconductor film 230. The transistor 107t includes conductive films 232 and 233 which function as a source electrode and a drain electrode and are provided over the semiconductor film 230. In the regions which are in the semiconductor film 230 and are not covered with the gate insulating film 231, the semiconductor film 230 is connected to the conductive films 232 and 233.

The conductive film 233 is connected to the conductive film 207 through an opening penetrating the insulating film 219.

Further, the transistor 107t includes a gate electrode 234 and sidewalls 235 which are provided over the gate insulating film 231 to overlap the semiconductor film 230. The sidewalls 235 are provided on side surfaces of the gate electrode 234. Part of the conductive film 232 and part of the conductive film 233 overlap the sidewalls 235. An insulating film 237 is formed over the conductive films 232 and 233.

The conductive films 232 and 233 are not necessarily in contact with the sidewalls 235. However, the structure where the conductive films 232 and 233 are in contact with the sidewalls 235 can eliminate a possibility of a change in the size of the area where the conductive films 232 and 233 are in contact with the semiconductor film 230, even in the case where the conductive films 232 and 233 deviate by a certain amount from appropriate positions. Accordingly, variations in on-state current of the transistor 107t due to the position deviation of the conductive films 232 and 233 can be prevented.

An insulating film 236 is provided over the gate electrode 234. The insulating film 236 is not necessarily provided. However, the structure where the insulating film 236 is over the gate electrode 234 can eliminate a possibility of contact of the conductive films 232 and 233 with the gate electrode 234, even in the case where the conductive films 232 and 233 deviate from appropriate positions to be formed over at least part of the gate electrode 234.

An insulating film 238 is provided over the transistor 107t and the insulating film 237, and a conductive film 239 is provided over the insulating film 238. Part where the conductive film 232 and the conductive film 239 are overlapped with each other with the insulating films 237 and 238 laid therebetween functions as the capacitor 105.

Note that FIG. 11 illustrates the case where the capacitor 105, together with the transistor 107t, is formed over the insulating film 219; however, the capacitor 105, together with the transistors 115 and 114, may be formed below the insulating film 219.

Further, in FIG. 11, the transistor 107t includes the gate electrode 234 on at least one side of the semiconductor film 230. Alternatively, the transistor 107t may include a pair of gate electrodes with the semiconductor film 230 laid therebetween.

As one example of a semiconductor material which has a wider band gap than a silicon semiconductor and has a lower intrinsic carrier density than silicon, a compound semiconductor such as silicon carbide (SiC) or gallium nitride (GaN) can be given in addition to an oxide semiconductor. Using the oxide semiconductor has the following advantage: transistors having excellent electrical characteristics can be formed by a sputtering method or a wet process, unlike silicon carbide or gallium nitride, and can be mass-produced easily. Further, unlike silicon carbide or gallium nitride, the oxide semiconductor can be formed at room temperature, whereby transistors having excellent electrical characteristics can be formed on a glass substrate or on an integrated circuit using silicon. Further, a larger substrate can be used. Accordingly, among the semiconductors with wide band gaps, the oxide semiconductor particularly has an advantage of high volume productivity. Further, in the case where an oxide semiconductor with high crystallinity is to be obtained in order to improve the property of a transistor (e.g., field-effect mobility), the oxide semiconductor with crystallinity can be easily obtained by heat treatment at 250° C. to 800° C.

Note that a purified oxide semiconductor (purified OS) obtained by reduction of impurities such as moisture or hydrogen which serves as an electron donor (donor) and by reduction of oxygen defects is an intrinsic (i-type) semiconductor or a substantially i-type semiconductor. Therefore, a transistor including the oxide semiconductor has a characteristic of a significantly low off-state current. Furthermore, the band gap of the oxide semiconductor is 2 eV or more, preferably 2.5 eV or more, more preferably 3 eV or more. With the use of the oxide semiconductor film which is purified by sufficiently reducing the concentration of impurities such as moisture or hydrogen and by reducing oxygen defects, off-state current of the transistor can be reduced.

Specifically, various experiments can prove a low off-state current of a transistor in which a purified oxide semiconductor is used for a channel formation region. For example, even when an element has a channel width of $1\times10^6$ μm and a channel length of 10 μm, off-state current can be lower than or equal to the measurement limit of a semiconductor parameter analyzer, i.e., lower than or equal to $1\times10^{-13}$ A, at a voltage (drain voltage) between the source electrode and the drain electrode of from 1 V to 10 V. In that case, it can be seen that off-state current standardized on the channel width of the transistor is lower than or equal to 100 zA/μm. In addition, a capacitor and a transistor were connected to each other and the off-state current was measured with a circuit in which electric charge flowing into or from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the purified oxide semiconductor film is used as a channel formation region is considerably lower than that of a transistor in which silicon having crystallinity is used.

Note that an oxide semiconductor preferably contains at least indium (In) or zinc (Zn). In particular, In and Zn are preferably contained. As a stabilizer for reducing variation in electric characteristics of a transistor including the oxide semiconductor, gallium (Ga) is preferably additionally included. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that for example, an "In—Ga—Zn-based oxide" means an oxide containing In, Ga, and Zn and there is no particular limitation on the ratio of In, Ga, and Zn. Further, the In—Ga—Zn-based oxide may contain a metal element other than In, Ga, and Zn. Note that an In—Ga—Zn-based oxide has sufficiently high resistance when there is no electric field and thus the off-state current can be sufficiently low. In addition, also having high mobility, the In—Ga—Zn-based oxide is suitable for a semiconductor material used in a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used in accordance with necessary electrical characteristics (such as mobility, threshold voltage, and variation in such characteristics). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, the oxide semiconductor film can be formed by a sputtering method using a target including indium (In), gallium (Ga), and zinc (Zn). In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the above atomic ratio, a polycrystal or a c-axis-aligned crystal (CAAC) OS to be described later is easily formed. The filling factor of the target including In, Ga, and Zn is 90% or higher and 100% or lower, and preferably 95% or higher and lower than 100%. With the use of the target with high filling rate, a dense oxide semiconductor film is formed.

In the case where an In—Zn-based oxide material is used as an oxide semiconductor, a target of the In—Zn-based oxide has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, in a target used for formation of an oxide semiconductor film including an In—Zn-based oxide which has an atomic ratio of In:Zn:O=X:Y:Z, the relation of Z>1.5X+Y is satisfied. The mobility can be improved by keeping the ratio of Zn within the above range.

In the case of forming a film of an In—Sn—Zn-based oxide semiconductor as an oxide semiconductor film by a sputtering method, it is preferable to use an In—Sn—Zn-based oxide target having the following atomic ratio: the atomic ratio of In:Sn:Zn is 1:1:1, 2:1:3, 1:2:2, or 4:9:7.

Specifically, the oxide semiconductor film may be formed as follows: the substrate is held in the chamber with pressure reduced, residual moisture in the chamber is removed, a sputtering gas from which hydrogen and moisture are removed is introduced, and the above-described target is used. The substrate temperature may be 100° C. to 600° C. inclusive, preferably 200° C. to 400° C. inclusive in film formation. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

Note that the oxide semiconductor film formed by sputtering or the like contains a large amount of moisture or hydrogen (including a hydroxyl group) as an impurity in some cases. Moisture and hydrogen easily form a donor level and thus serve as impurities in the oxide semiconductor. Thus, in one mode of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the oxide semiconductor film, moisture or hydrogen in the oxide semiconductor film can be lost. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When an RTA method is used for the heat treatment, dehydration or dehydrogenation can be performed in a short time; therefore, treatment can be performed even at a temperature higher than the strain point of a glass substrate.

Note that in some cases, the heat treatment makes oxygen released from the oxide semiconductor film and oxygen deficiency is formed in the oxide semiconductor film. Thus, it is preferable that treatment for supplying oxygen to the semiconductor film 230 be performed after the heat treatment, so that oxygen vacancies are reduced.

For example, by heat treatment performed in an atmosphere containing oxygen, oxygen can be supplied to the semiconductor film 230. Heat treatment for supplying oxygen may be performed under conditions similar to those of the above heat treatment for reducing the concentration of moisture or hydrogen. Note that heat treatment for supplying oxygen is performed in an atmosphere containing oxygen, such as an oxygen gas or an ultra dry air atmosphere (the moisture content is lower than or equal to 20 ppm (−55° C. by conversion into a dew point), preferably lower than or equal to 1 ppm, further preferably lower than or equal to 10 ppb, in the measurement with use of a dew point meter of a cavity ring down laser spectroscopy (CRDS) system).

It is preferable that in the gas containing oxygen, the concentration of water or hydrogen be low. Specifically, the concentration of impurities in the oxygen gas is lower than or equal to 1 ppm, preferably lower than or equal to 0.1 ppm.

Alternatively, as a method for supplying oxygen to the semiconductor film 230, an ion implantation method, an ion doping method, a plasma immersion ion implantation method, plasma treatment, or the like can be used. If a crystal part included in the semiconductor film 230 is damaged after oxygen is supplied to the semiconductor film 230, heat treatment may be performed so that the damaged crystal part is repaired.

An insulating film containing oxygen may be used as an insulating film, such as a gate insulating film, which is in contact with the oxide semiconductor film so that oxygen is supplied from the insulating film to the oxide semiconductor film. The insulating film containing oxygen is preferably made to contain oxygen in a proportion higher than that in the stoichiometric composition by heat treatment in an oxygen atmosphere, oxygen doping, or the like. Oxygen doping means addition of oxygen into a semiconductor film. In addition, "oxygen doping" includes "oxygen plasma doping" in which oxygen which is made to be plasma is added to a semiconductor film. The oxygen doping may be performed by ion implantation or ion doping. By oxygen doping treatment, an insulating film that includes a region where the proportion of oxygen is higher than that in the stoichiometric composition can be formed. Then, a heat treatment is performed after formation of the insulating film including oxygen, so that oxygen is supplied from the insulating film to the oxide semiconductor film. With the above structure, oxygen defects serving as donors can be reduced in the oxide semiconductor film and the stoichiometric composition of the oxide semiconductor included in the oxide semiconductor film can be satisfied. It is preferable that the proportion of oxygen in the oxide semiconductor film be higher than the stoichiometric proportion. As a result, the oxide semiconductor film can be made substantially i-type and variation in electrical characteristics of the transistors due to oxygen defects can be reduced; thus, electrical characteristics can be improved.

Note that the heat treatment for supplying oxygen from the insulating film to the oxide semiconductor film is performed in an atmosphere of nitrogen, ultra dry air, or a rare gas (e.g., argon or helium) preferably at 200° C. to 400° C., for example, 250° C. to 350° C. It is preferable that the water content in the gas be 20 ppm or less, preferably 1 ppm or less, further preferably 10 ppb or less.

In addition, the semiconductor film 230 can be an oxide semiconductor film which is in a single crystal state, a polycrystalline (also referred to as polycrystal) state, an amorphous state, or the like. Preferably, a CAAC-OS (c-axis aligned crystalline oxide semiconductor) film can be used as the oxide semiconductor film.

Sputtering may be performed to form an oxide semiconductor film including a CAAC-OS film. In order to obtain a CAAC-OS film by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., 150 mm to 200 mm) and a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Therefore, micro-defects in the film and defects at the interface of a stacked layer can be compensated.

An oxide semiconductor film may be in a non-single-crystal state, for example. The non-single-crystal state is, for example, structured by at least one of c-axis aligned crystal (CAAC), polycrystal, microcrystal, and an amorphous part. Among c-axis aligned crystal (CAAC), polycrystal, microcrystal, and an amorphous part, an amorphous part has the highest density of defect states, whereas CAAC has the lowest density of defect state. Note that an oxide semiconductor including CAAC is referred to as a CAAC-OS (c-axis aligned crystalline oxide semiconductor).

For example, the oxide semiconductor film may include a CAAC-OS. The CAAC-OS includes, for example, an oxide semiconductor in which c-axes are aligned, and a-axes and/or b-axes are not macroscopically aligned.

For example, an oxide semiconductor film may include microcrystal. A microcrystalline oxide semiconductor film includes, for example, an oxide semiconductor including microcrystal with a size greater than or equal to 1 nm and less than 10 nm. Alternatively, a microcrystalline oxide semiconductor film, for example, includes an oxide semiconductor having a crystal-amorphous mixed phase structure where crystal parts (each of which is greater than or equal to 1 nm and less than 10 nm) are distributed in an amorphous phase.

For example, the oxide semiconductor film may include an amorphous part. An amorphous oxide semiconductor film), for example, has disordered atomic arrangement and no crystalline component. Alternatively, an amorphous oxide semiconductor film contains, for example, an oxide semiconductor which is absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of an a-axis and a b-axis of one crystal part may be different from those of another crystal part. An example of such an oxide semiconductor film is a CAAC-OS film.

The CAAC-OS film is neither absolutely single crystal (i.e., it is a type of non-single crystal) nor absolutely amorphous. The CAAC-OS film contains, for example, an oxide semiconductor with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not clearly detected. Thus, in the CAAC-OS film, a reduction in electron mobility, due to the grain boundary, is suppressed.

In each of the crystal parts included in the CAAC-OS film, for example, a c-axis is aligned so as to be in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the c-axes of the crystal parts are aligned in the direction parallel to a normal vector of the surface where the CAAC-OS film is formed or a normal vector of the surface of the CAAC-OS film. The crystal part is formed by film formation or by performing treatment for crystallization such as heat treatment after film formation.

In a transistor including the CAAC-OS film, a change in electrical characteristics due to irradiation with visible light or ultraviolet light is small. Thus, the transistor has high reliability.

For example, the CAAC-OS film is formed by a sputtering method with a polycrystalline metal oxide sputtering target. By collision of ions with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

This embodiment can be combined with any of the other embodiments as appropriate.

(Embodiment 4)

The semiconductor device according to one embodiment of the present invention can be used for display devices, laptops, or image reproducing devices provided with recording media (typically devices which reproduce the content of recording media such as DVDs (digital versatile disc) and have displays for displaying the reproduced images). Further, as an electronic appliance which can include the semiconductor device including a programmable LSI according to one embodiment of the present invention, cellular phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 12A to 12F illustrate specific examples of these electronic appliances.

Figure 12A:
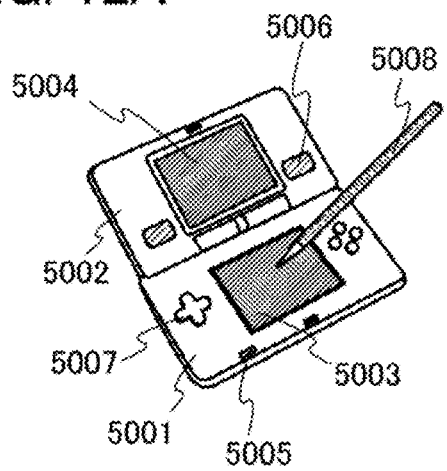
FIGS. 12A to 12F each illustrate an electronic appliance.

FIG. 12A illustrates a portable game console including a housing 5001, a housing 5002, a display portion 5003, a display portion 5004, a microphone 5005, speakers 5006, operation keys 5007, and a stylus 5008. Although the portable game console in FIG. 12A has the two display portions 5003 and 5004, the number of display portions included in a portable game console is not limited to this.

Figure 12B:
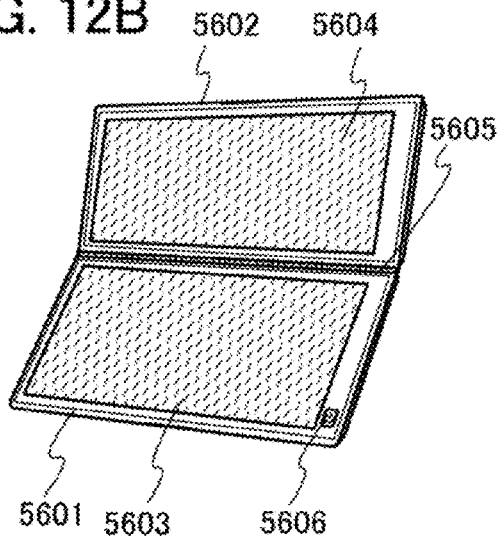

FIG. 12B illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 12C:
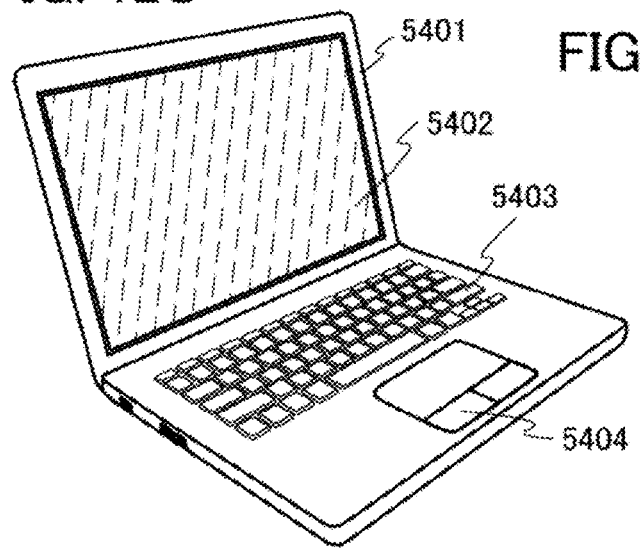

FIG. 12C illustrates a laptop personal computer including a housing 5401, a display portion 5402, a keyboard 5403, a pointing device 5404, and the like.

Figure 12D:
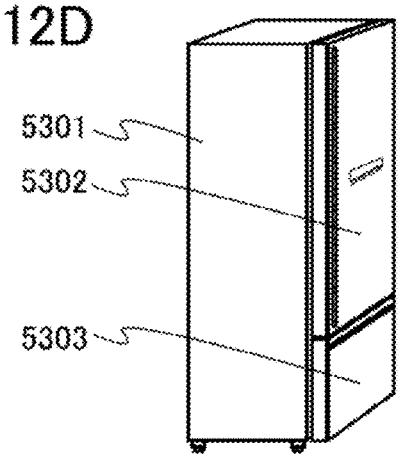

FIG. 12D illustrates the electric refrigerator-freezer including a housing 5301, a door for a refrigerator 5302, a door for a freezer 5303, and the like.

Figure 12E:
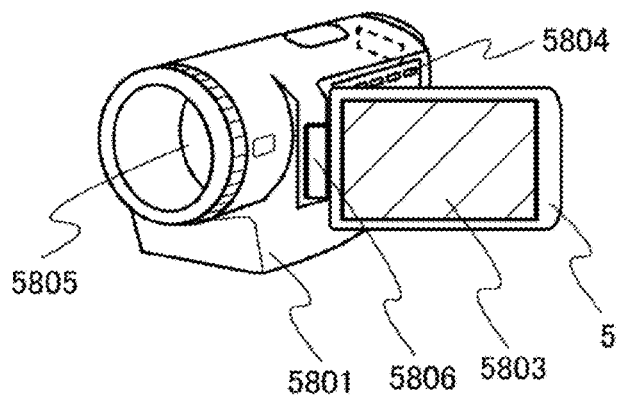

FIG. 12E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 and the second housing 5802 are connected to each other with the joint 5806, and an angle between the first housing 5801 and the second housing 5802 can be changed with the joint 5806. The image displayed on the display portion 5803 may be switched depending on the angle in the joint 5806 between the first housing 5801 and the second housing 5802.

Figure 12F:
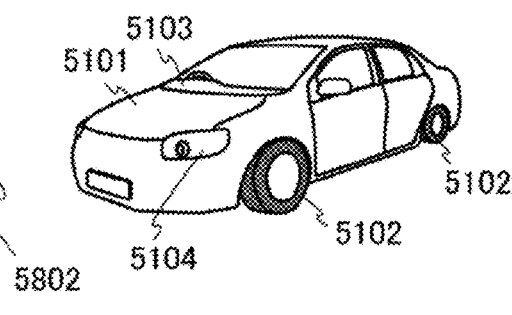

FIG. 12F illustrates an ordinary motor vehicle including a car body 5101, wheels 5102, a dashboard 5103, lights 5104, and the like.

This embodiment can be combined with any of the other embodiments as appropriate.

(Embodiment 5)

FIG. 13 illustrates part of a cross sectional structure of a semiconductor device according to one embodiment of the present invention, as an example. Note that FIG. 13 shows the transistor 107t, the capacitor 105, and the transistor 115, as an example.

In this embodiment, the case where the transistor 115 is formed in a single crystal silicon substrate, and the transistor 107t in which an oxide semiconductor is used for its active layer and the capacitor 105 are formed above the transistor 115 is illustrated. The transistor 115 may include a thin film of an amorphous, microcrystalline, polycrystalline, or single crystal semiconductor (e.g., silicon or germanium) as an active layer. Alternatively, the transistor 115 may include an active layer containing an oxide semiconductor. In the case where all of the transistors include an active layer containing an oxide semiconductor, the transistor 107t is not necessarily stacked over the transistor 115, and the transistors 107t and 115 may be formed in the same layer.

In the case where the transistor 115 is formed using a thin silicon film, any of the following can be used: amorphous silicon manufactured by a vapor phase growth method such as a plasma CVD method, or a sputtering method; polycrystalline silicon obtained in such a manner that amorphous silicon is crystallized by treatment such as laser annealing; single crystal silicon obtained in such a manner that implantation of hydrogen ions or the like into a silicon wafer is performed and a surface portion of the single crystal silicon wafer is separated; and the like.

Note that in the case where transistors in a memory circuit are the transistor 107t containing an oxide semiconductor and the other transistors (including the transistor 115) containing silicon, the number of transistors containing an oxide semiconductor can be smaller than the number of transistors containing silicon. As a result, the design rule for the transistor 107t can be relaxed by stacking the transistor 107t over a transistor containing silicon.

In FIG. 13, the n-channel transistor 115 is formed in the semiconductor substrate 400.

The semiconductor substrate 400 can be, for example, a silicon substrate having n-type or p-type conductivity, a germanium substrate, a silicon germanium substrate, a compound semiconductor substrate (e.g., a GaAs substrate, an InP substrate, a GaN substrate, a SiC substrate, a GaP substrate, a GaInAsP substrate, or a ZnSe substrate), or the like. In FIG. 13, the case where a single crystal silicon substrate having n-type conductivity is used is illustrated as an example.

The transistor 115 is electrically isolated from the other transistors by an element isolation insulating film 401. For formation of the element isolation insulating film 401, a selective oxidation method (local oxidation of silicon (LO-COS) method), a trench isolation method, or the like can be used.

Specifically, the transistor 115 includes the impurity regions 402 and 403 which are formed in the semiconductor substrate 400 and function as a source region and a drain region, a gate electrode 404, and a gate insulating film 405 sandwiched between the semiconductor substrate 400 and the gate electrode 404. The gate electrode 404 overlaps a channel formation region formed between the impurity regions 402 and 403 with the gate insulating film 405 laid therebetween.

An insulating film 409 is provided over the transistor 115. Openings are formed to penetrate the insulating film 409. Wirings 410 and 411 are formed in the openings and are in contact with the impurity regions 402 and 403, respectively.

The wirings 410 and 411 are connected to wirings 415 and 416 which are formed over the insulating film 409, respectively An insulating film 420 is formed over the wirings 415 and 416. An opening is formed to penetrate the insulating film 420, and the wiring 421 connected to the wiring 416 is formed in the opening.

In FIG. 13, the transistor 107t and the capacitor 105 are formed over the insulating film 420.

The transistor 107t includes a semiconductor film 430 containing an oxide semiconductor over the insulating film 420; conductive films 432 and 433 which function as source and drain electrodes and are provided over the semiconductor film 430; a gate insulating film 431 over the semiconductor film 430, the conductive film 432, and the conductive film 433; and a gate electrode 434 which is provided over the gate insulating film 431 and overlaps the semiconductor film 430 in the region between the conductive films 432 and 433.

A conductive film 435 is provided over the gate insulating film 431 to overlap the conductive film 433. Part where the conductive films 433 and 435 overlapping with each other with the gate insulating film 431 laid therebetween functions as the capacitor 105.

The wiring 421 is connected to the conductive film 432.

Note that FIG. 13 illustrates the case where the capacitor 105 is provided over the insulating film 420 together with the transistor 107t, as an example. However, the capacitor 105 may be provided below the insulating film 420 together with the transistor 115.

In addition, an insulating film 441 is provided over the transistor 107t and the capacitor 105. An opening is provided to penetrate the insulating film 441. A conductive film 443 which is in contact with the gate electrode 434 is provided over the insulating film 441 in the opening.

Note that in FIG. 13, the transistor 107t includes the gate electrode 434 on at least one side of the oxide semiconductor film 430. Alternatively, the transistor 107t may include a pair of gate electrodes provided with the oxide semiconductor film 430 laid therebetween.

When the transistor 107t has a pair of gate electrodes between which the semiconductor film 430 is provided, a signal for controlling switching is supplied to one of the gate electrodes, and the other of the gate electrodes may be in a floating state (i.e., electrically insulated) or a potential may be supplied to the other of the gate electrodes. In the latter case, potentials with the same level may be supplied to the pair of electrodes, or a fixed potential such as a ground potential may be supplied only to the other of the gate electrodes. By controlling the level of a potential supplied to the other of the gate electrodes, the threshold voltage of the transistor can be controlled.

This embodiment can be combined with any of the other embodiments as appropriate.

(Embodiment 6)

In this embodiment, an example of a semiconductor device according to one embodiment of the present invention will be described.

Figure 14:
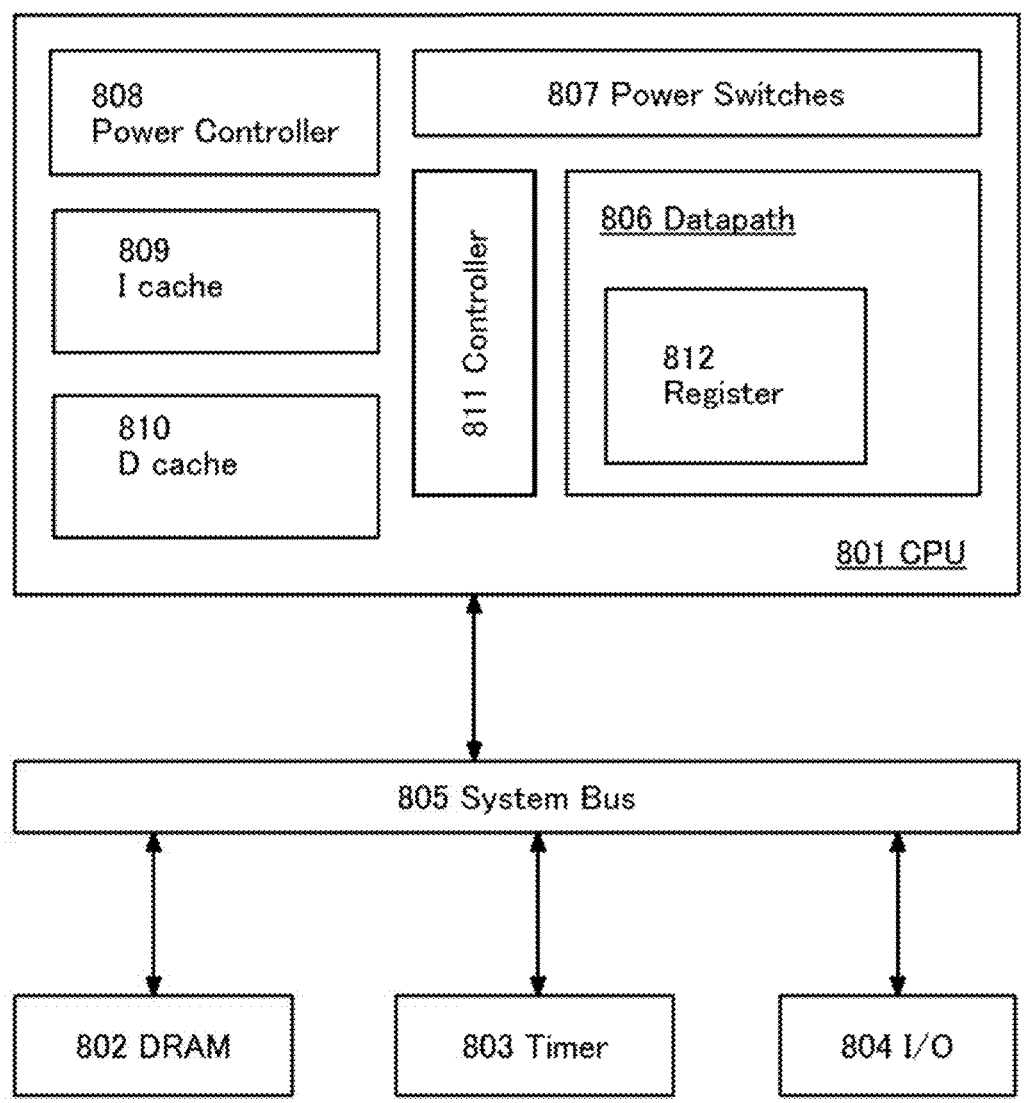
FIG. 14 is a block diagram of a semiconductor device.

FIG. 14 is a block diagram showing a structure of a semiconductor device 800 according to one embodiment of the present invention. The semiconductor device 800 illustrated in FIG. 14 includes a CPU 801, a DRAM 802, a timer (Timer) 803, an I/O port (I/O) 804, a system bus (System Bus) 805, and the like.

The DRAM 802 has a function as a main memory device which stores an instruction executed by the CPU 801, data, and the like. The timer 803 has functions of measuring time and generating a signal that includes the measured time as data. The I/O port 804 has a function as an interface for input/output of a signal between a device outside the semiconductor device 800 and the semiconductor device 800. The system bus 805 has a function as a point of signal transfer between the CPU 801 and each of the DRAM 802, the timer 803, and the I/O port 804.

The CPU 801 includes a data path (Datapath) 806, power switches (Power Switches) 807, a power controller (Power Controller) 808, an instruction cache (I cache) 809, a data cache (D cache) 810, and a controller (Controller) 811.

The controller 811 corresponds to a control device and has functions of decoding and executing an instruction.

The data path 806 includes a circuit performing arithmetic processing, such as an ALU, a shifter, a multiplier, or a floating-point unit, in addition to a register (Register) 812.

The power controller 808 has a function of controlling the supply of a power supply voltage to the instruction cache 809, the data cache 810, and the data path 806 by selecting a conductive or non-conduction state of each of the power switches 807 in accordance with an instruction from the data path 806. Note that FIG. 14 illustrates the power controller 808 as one component of the CPU 801; however, the power controller 808 is not necessarily a component of the CPU 801. A semiconductor device according to one embodiment of the present invention may include the power controller 808 as a component separated from the CPU 801.

In the semiconductor device 800 according to one embodiment of the present invention, the memory element 100 in the above embodiments can be used for the instruction cache 809, the data cache 810, or the register 812. Using the memory element 100 shown in the above embodiments for a buffer storage device such as the instruction cache 809, the data cache 810, or the register 812 can prevent loss of data in the buffer storage device due to the stop of the supply of power supply voltage. Further, the state before the stop of the supply of power supply voltage can be saved in a short time, and the storage device can restore the data in a short time after the supply of power supply voltage is restarted. Thus, in the entire CPU 801 or a semiconductor device including the CPU 801, the supply of power supply voltage can be stopped a time as long as 60 seconds, or as short as several milliseconds. Therefore, power consumption of the semiconductor device 800 can be low.

Table 1 shows an example of specifications of the semiconductor device 800.

TABLE 1

| Technology | Si | 0.35 μm |
|---|---|---|
|  | OS | 0.8 μm |
| Architecture |  | 32-bit RISC |
| Size (W × H) |  | 12 mm × 12 mm |
| Number of transistors |  | Approx. 100k |
| Clock frequency |  | 25 MHz |
| Power supply voltage | Si | 2.5 V |
|  | OS | 3.2 V |

This embodiment can be combined with any of the other embodiments as appropriate.

(Embodiment 7)

In this embodiment, a memory element which is in a memory device according to one embodiment of the present invention and can store 1-bit data has a different structure from the above embodiments and is illustrated for example. Note that the memory device according to one embodiment of the present invention can be used for the data cache 603 or the instruction cache 604, which is described in Embodiment 2, or the data cache 810 or the instruction cache 809, which is described in Embodiment 5.

Figure 15A:
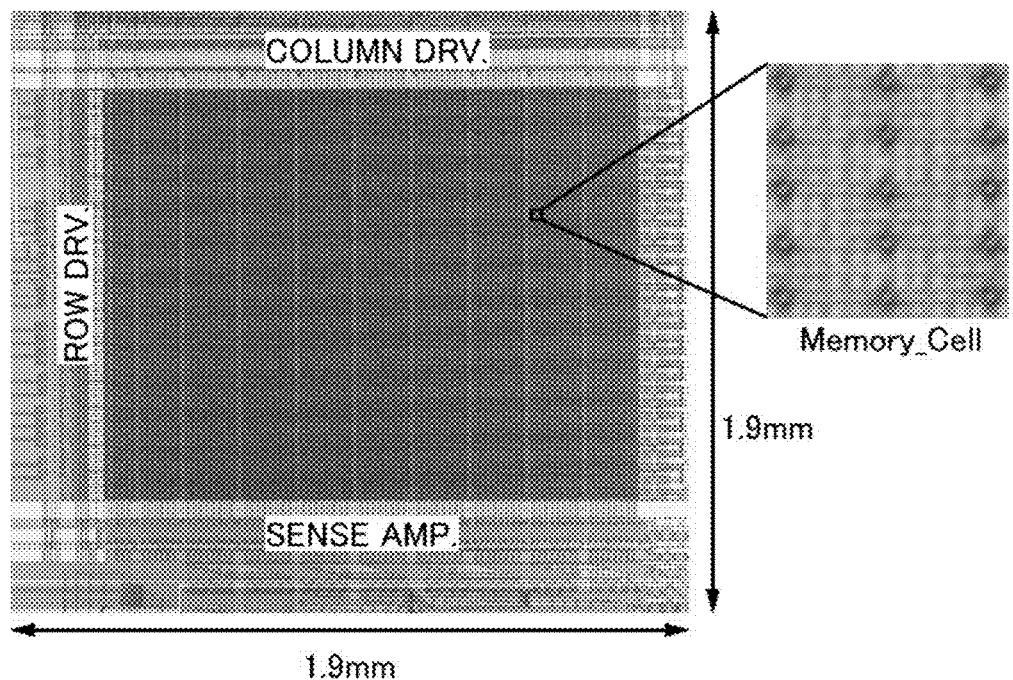
FIG. 15A is a photomicrograph of a memory device.

The memory device according to one embodiment of the present invention includes one or more of memory elements capable of storing 1-bit data. FIG. 15A is a photomicrograph of a memory device fabricated to include a plurality of memory elements (Memory_Cell).

The memory elements in FIG. 15A are provided in matrix. A column driver (COLUMN_DRV.), a row driver (ROW_DRV.), and a sense amplifier (SENSE_AMP.) are provided on the periphery of the memory elements.

Figure 15B:
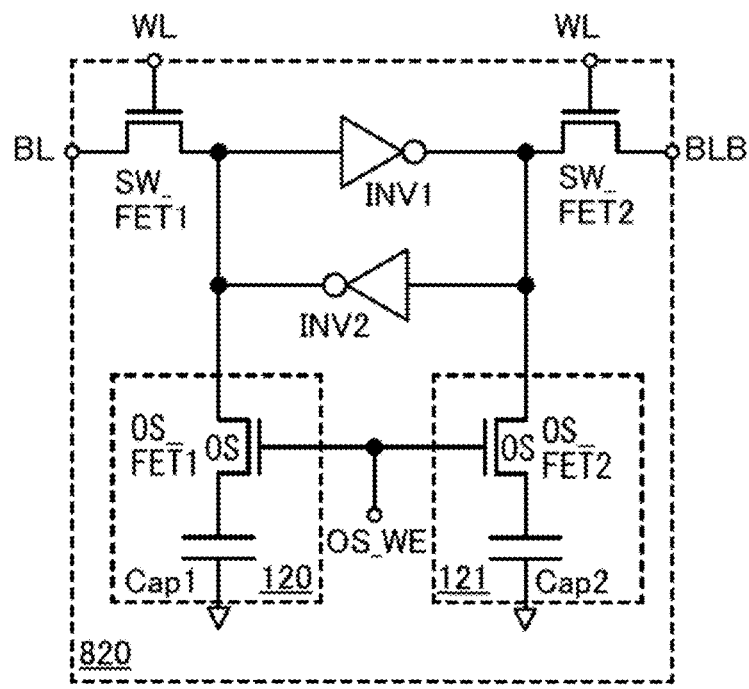
FIG. 15B illustrates the structure of the memory device.

FIG. 15B illustrates a configuration of the memory element included in the fabricated memory device illustrated in FIG. 15A.

A memory element 820 illustrated in FIG. 15B includes a transistor SW_FET1 and a transistor SW_FET2 which function as switches, an inverter INV1 and an inverter INV2 which have functions of inverting the polarities of the potentials of input terminals and outputting the potentials from output terminals, a transistor OS_FET1 and a transistor OS_FET2 each of which is a transistor having an extremely low off-state current and used as a switch, and a capacitor Cap1 and a capacitor Cap2 which have a function of holding electric charge.

In the configuration illustrated in FIG. 15B, the transistor SW_FET1 and the transistor SW_FET2 correspond to examples of the switches 103 and 104 described in Embodiment 1. The inverter INV1 and the inverter INV2 correspond to examples of the logic elements 101 and 102 described in Embodiment 1. The transistor OS_FET1, the transistor OS_FET2, the capacitor Cap1, and the capacitor Cap2 correspond to examples of the memory circuits 120 and 121 described in Embodiment 1. An input terminal of the inverter INV1 is connected to an output terminal of the inverter INV2, and an input terminal of the inverter INV2 is connected to an output terminal of the inverter INV1.

The inverter INV1 and the inverter INV2 can hold data written through the transistor SW_FET1 and the transistor SW_FET2, respectively, by the supply of a power supply voltage from the same wirings.

The capacitor Cap1 is connected to the input terminal of the inverter INV1 through the transistor OS_FET1 so as to be able to store data held in the inverter INV1 and the inverter INV2 as needed. The capacitor Cap2 is connected to the input terminal of the inverter INV2 through the transistor OS_FET2 so as to be able to store data held in the inverter INV1 and the inverter INV2 as needed.

Specifically, the capacitor Cap1 is a capacitor in which a dielectric is sandwiched between a pair of electrodes. One of the electrodes is connected to the input terminal of the inverter INV1 through the transistor OS_FET1, and the other electrode is connected to a node to which a potential such as a ground potential is supplied. The capacitor Cap2 is a capacitor in which a dielectric is sandwiched between a pair of electrodes. One of the electrodes is connected to the input terminal of the inverter INV2 through the transistor OS_FET2, and the other electrode is connected to a node to which a potential such as a ground potential is supplied.

In one embodiment of the present invention, a transistor having an extremely low off-state current is used for the transistors OS_FET1 and OS_FET2. With such a structure, even when the supply of the power supply voltage to the memory element 820 is stopped, data can be held in the memory circuits 120 and 121 by turning off the transistors OS_FET1 and OS_FET2. As a result, data held in the inverters INV1 and INV2 is saved on the memory circuits 120 and 121 before the supply of a power supply voltage to the memory element 820 is stopped so that loss of the data can be prevented.

Note that in an example of operation of the memory element 820 illustrated in FIG. 15B, the transistor SW_FET1, the transistor SW_FET2, the transistor OS_FET1, and the transistor OS_FET2 that serve as switches may operate by switching of the switches, like the switches 103, 104, 107, and 108 shown in the timing chart in FIG. 4. Specifically, the supply of a power supply voltage to a bit line BL, an inverted bit line BLB, a word line WL, a control line OS_WE, and the inverters INV1 and INV2 which are connected to the transistors SW_FET1, SW_FET2, OS_FET1, and OS_FET2 may be stopped or restarted at the timing between saving and restoring of data.

(Embodiment 8)

Figure 16A:
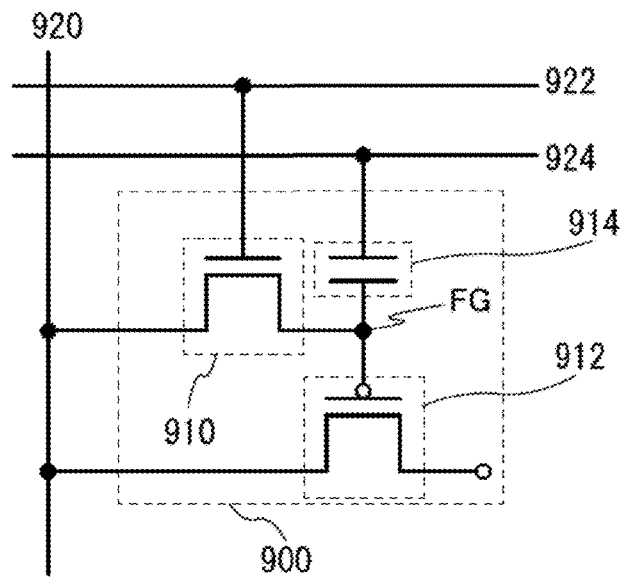
FIG. 16A illustrates the structure of a memory device.

In this embodiment, an example of a memory element which can be used as a cache described in the above embodiments will be described with reference to FIGS. 16A and 16B and FIG. 17. FIG. 16A is a circuit diagram of a memory element 900 as an example of the memory element.

The memory element 900 in FIG. 16A includes a transistor 910, a transistor 912, and a capacitor 914 and is electrically connected to a wiring 920, a wiring 922, and the wiring 924. The transistor 910 can be the same or substantially same as the transistor 107t or 108t in the above embodiments, and is a transistor including an oxide semiconductor film having a channel formation region in this embodiment. The transistor 912 can be the same or substantially same as the transistor 103t or 104t in the above embodiments.

One of a source terminal and a drain terminal of the transistor 910 is connected to the wiring 920, and the other of the source terminal and the drain terminal of transistor 910 is connected to a gate electrode of the transistor 912 and one electrode of the capacitor 914. A gate electrode of the transistor 910 is connected to the wiring 922. One of a source terminal and a drain terminal of the transistor 912 is connected to the wiring 920, and a predetermined potential is supplied to the other of the source terminal and the drain terminal of the transistor 912 through a wiring. The other electrode of the capacitor 914 is connected to the wiring 924.

A feature of the transistor 910 is an extremely low off-state current. Therefore, by turning off the transistor 910, the potential of a node at which the other of the source terminal and the drain terminal of the transistor 910, the gate electrode of the transistor 912, and the one electrode of the capacitor 914 are connected to one another (hereinafter, referred to as a node FG) can be held for a long time. The capacitor 914 facilitates holding of electric charge given to the node FG and reading of the held data.

To store data in the memory element 900 (in writing of data), the potential of the wiring 922 is set to a potential at which the transistor 910 is turned on, whereby the transistor 910 is turned on. Thus, the potential of the wiring 920 is supplied to the node FG and a predetermined amount of electric charge is accumulated in the node FG. After that, the potential of the wiring 924 is set to a potential at which the transistor 910 is turned off, whereby the transistor 910 is turned off. Accordingly, the predetermined amount of electric charge is held in the node FG The predetermined amount of electric charge is thus accumulated and held in the node FG, whereby the memory cell can store data.

To read the stored data (data read), first, a potential by which the transistor 912 is turned on or off (reading potential) is supplied to the transistor 912 by using the electric charge held at the node FG while the predetermined potential (constant potential) is supplied to the other of the source and drain terminals of the transistor 912. Then, an on state or an off state of the transistor 912 is read, i.e., the potential of the wiring 920 is read, whereby the stored data can be read.

Figure 16B:
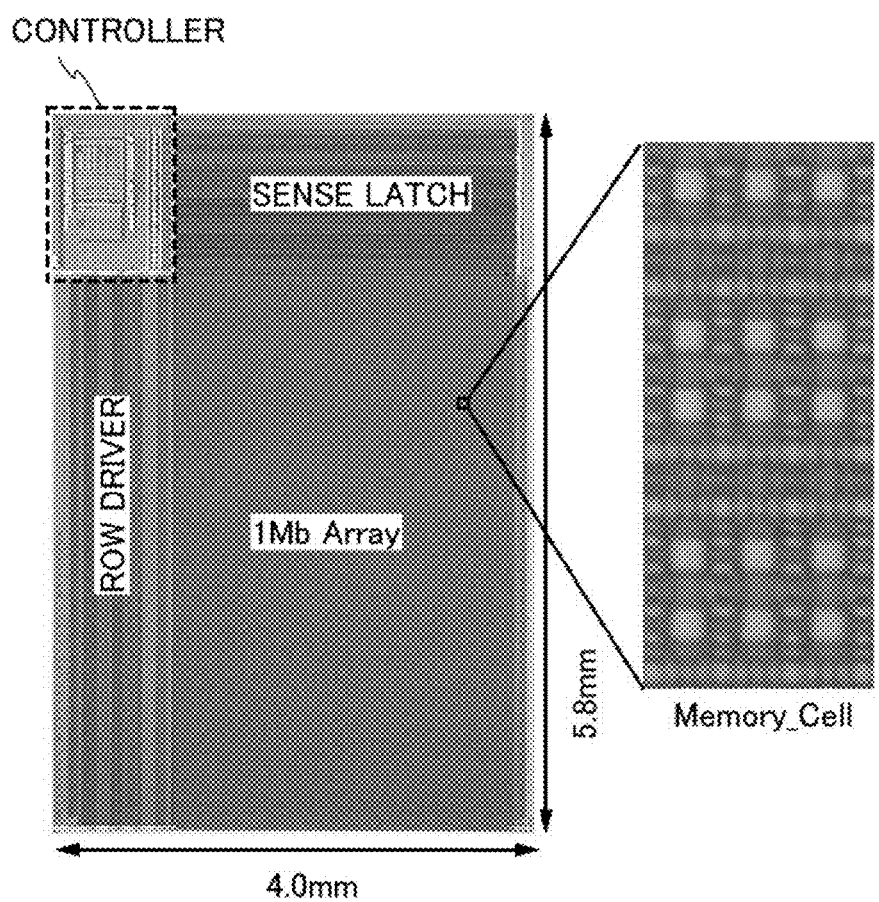
FIG. 16B is a photomicrograph of the memory device.

FIG. 16B is a photomicrograph of a memory device formed by arranging the memory elements 900 illustrated in FIG. 16A in matrix. The memory device in FIG. 16B includes a memory cell array in which the memory elements 900 are arranged as memory cells in matrix, a row driver, a sense latch, and a controller.

The memory device in FIG. 16B has a row direction length of 4.0 mm, a column direction length of 5.8 mm, and a storage capacity of 1 Mbit.

Figure 17:
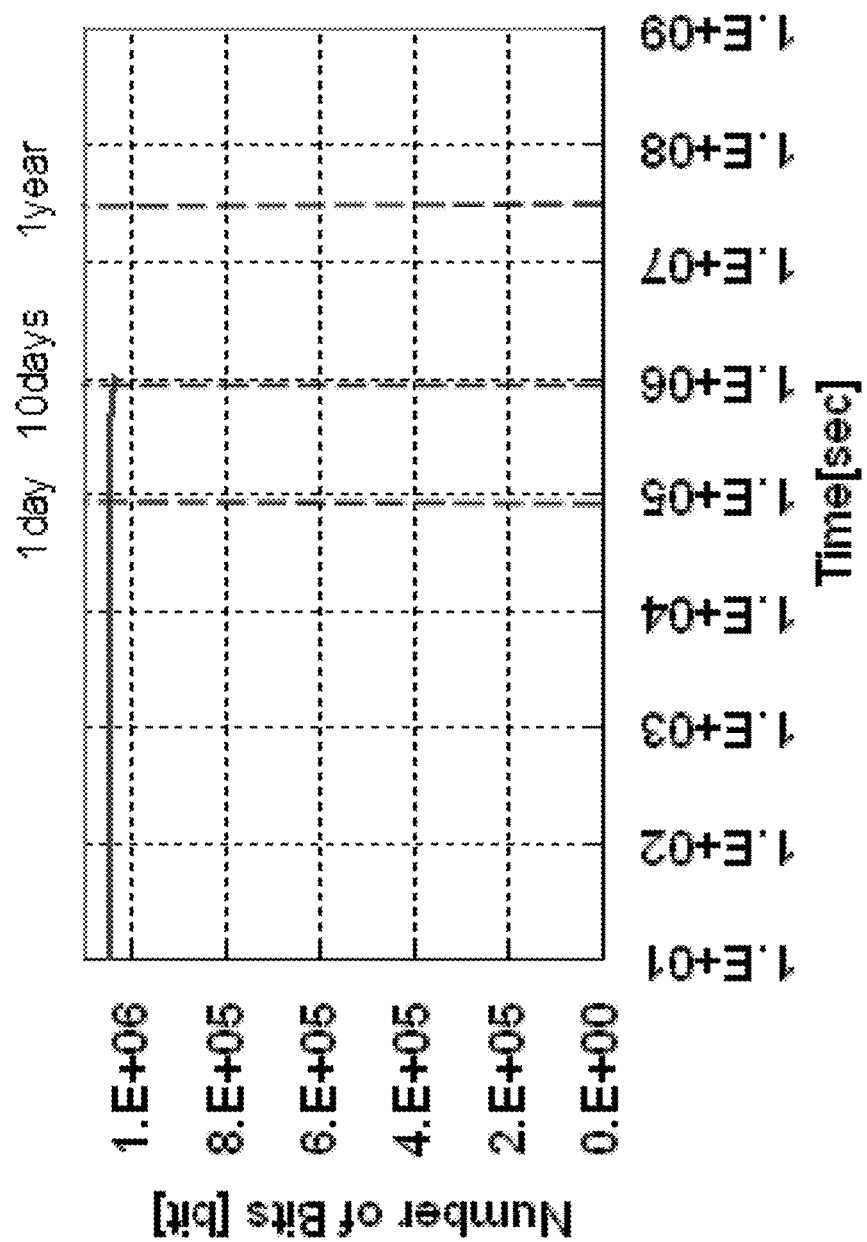
FIG. 17 is a graph showing data retention characteristics of a memory device.

FIG. 17 shows the result of measuring data retention characteristics of the memory device in FIG. 16B. The data retention characteristics are measured at 125° C. under a condition that a voltage of −2 V is supplied to the wiring 922 in FIG. 16A.

In a graph of FIG. 17, a horizontal axis represents time (second) and a vertical axis represents the number of bits of held data. As shown in FIG. 17, the memory device in FIG. 16B sufficiently holds data for as long as 10 days or more at 125° C. The acceleration factor at 125° C. is approximately $10^4$ times as much as the acceleration factor at room temperature. Therefore, it can be estimated that the memory device in FIG. 16B can hold data for 10 years or more at a room temperature.

As described above, a transistor whose channel formation region contains a semiconductor with a wide band gap, such as an oxide semiconductor, is used for a memory device, so that a memory device having favorable data retention characteristics can be provided.

This embodiment can be combined with any of the other embodiments as appropriate.

This application is based on Japanese Patent Application serial no. 2012-038468 filed with Japan Patent Office on Feb. 24, 2012, Japanese Patent Application serial no. 2012-105537 filed with Japan Patent Office on May 3, 2012, and Japanese Patent Application serial no. 2012-192232 filed with Japan Patent Office on Aug. 31, 2012, the entire contents of which are hereby incorporated by reference.

What is claimed is:

1. A semiconductor device comprising:
   a memory element comprising:
      a first logic element configured to output one of a first power supply potential and a second power supply potential to an output terminal of the first logic element in accordance with a potential of an input terminal of the first logic element;
      a second logic element configured to output one of the first power supply potential and the second power supply potential to an output terminal of the second logic element in accordance with a potential of an input terminal of the second logic element;
      a first memory circuit electrically connected to the input terminal of the first logic element; and
      a second memory circuit electrically connected to the input terminal of the second logic element;
   a first wiring electrically connected to the first logic element; and
   a second wiring electrically connected to the second logic element,
   wherein the input terminal of the first logic element is electrically connected to the output terminal of the second logic element,
   wherein the input terminal of the second logic element is electrically connected to the output terminal of the first logic element,
   wherein the first memory circuit is configured such that a potential of the input terminal of the first logic element is supplied to the first memory circuit during a first period and then a potential of the first memory circuit is supplied to the input terminal of the first logic element during a second period,
   wherein the second memory circuit is configured such that a potential of the input terminal of the second logic element is supplied to the second memory circuit during the first period and then a potential of the second memory circuit is supplied to the input terminal of the second logic element during the second period,
   wherein the first wiring is configured to be supplied with the second power supply potential after the first period and the first power supply potential before the second period, and
   wherein the second wiring is configured to be supplied with the second power supply potential after the first period and the first power supply potential after the second period.

2. The semiconductor device according to claim 1, wherein each of the first logic element and the second logic element is a logic element selected from the group of consisting an inverter and a clocked inverter.

3. The semiconductor device according to claim 1,
   wherein each of the first memory circuit and the second memory circuit comprises a transistor and a capacitor, and
   wherein the transistor comprises a channel formation region comprising a semiconductor that has a wider band gap than silicon and a lower intrinsic carrier density than silicon.

4. The semiconductor device according to claim 1,
wherein each of the first memory circuit and the second memory circuit comprises a transistor and a capacitor, and
wherein the transistor comprises a channel formation region comprising an oxide semiconductor.

5. The semiconductor device according to claim 1, wherein each of the first logic element and the second logic element comprises a transistor comprising a channel formation region comprising silicon with crystallinity.

6. The semiconductor device according to claim 1, further comprising a first switch and a second switch,
wherein the input terminal of the first logic element is electrically connected to a fourth wiring through the first switch,
wherein the input terminal of the second logic element is electrically connected to a fifth wiring through the second switch,
wherein a first data is supplied to the fourth wiring, and
wherein a second data is supplied to the fifth wiring.

7. A semiconductor device comprising:
a CPU comprising a cache comprising:
a first logic element configured to output one of a first power supply potential and a second power supply potential to an output terminal of the first logic element in accordance with a potential of an input terminal of the first logic element;
a second logic element configured to output one of the first power supply potential and the second power supply potential to an output terminal of the second logic element in accordance with a potential of an input terminal of the second logic element;
a first memory circuit electrically connected to the input terminal of the first logic element; and
a second memory circuit electrically connected to the input terminal of the second logic element;
a first wiring electrically connected to the first logic element;
a second wiring electrically connected to the second logic element; and
a power controller configured to determine whether or not a power supply voltage is supplied to the CPU,
wherein the input terminal of the first logic element is electrically connected to the output terminal of the second logic element,
wherein the input terminal of the second logic element is electrically connected to the output terminal of the first logic element,
wherein the first memory circuit is configured such that a potential of the input terminal of the first logic element is supplied to the first memory circuit during a first period and then a potential of the first memory circuit is supplied to the input terminal of the first logic element during a second period,
wherein the second memory circuit is configured such that a potential of the input terminal of the second logic element is supplied to the second memory circuit during the first period and then a potential of the second memory circuit is supplied to the input terminal of the second logic element during the second period,
wherein the first wiring is configured to be supplied with the second power supply potential after the first period and the first power supply potential before the second period, and
wherein the second wiring is configured to be supplied with the second power supply potential after the first period and the first power supply potential after the second period.

8. The semiconductor device according to claim 7, wherein each of the first logic element and the second logic element is a logic element selected from the group of consisting an inverter and a clocked inverter.

9. The semiconductor device according to claim 7,
wherein each of the first memory circuit and the second memory circuit comprises a transistor and a capacitor, and
wherein the transistor comprises a channel formation region comprising a semiconductor that has a wider band gap than silicon and a lower intrinsic carrier density than silicon.

10. The semiconductor device according to claim 7,
wherein each of the first memory circuit and the second memory circuit comprises a transistor and a capacitor, and
wherein the transistor comprises a channel formation region comprising an oxide semiconductor.

11. The semiconductor device according to claim 7, wherein each of the first logic element and the second logic element comprises a transistor comprising a channel formation region comprising silicon with crystallinity.

12. The semiconductor device according to claim 7, further comprising a first switch and a second switch,
wherein the input terminal of the first logic element is electrically connected to a fourth wiring through the first switch,
wherein the input terminal of the second logic element is electrically connected to a fifth wiring through the second switch,
wherein a first data is supplied to the fourth wiring, and
wherein a second data is supplied to the fifth wiring.

* * * * *